(12) United States Patent
Ausserlechner

(10) Patent No.: US 9,316,705 B2
(45) Date of Patent: Apr. 19, 2016

(54) VERTICAL HALL EFFECT-DEVICE

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 141 days.

(21) Appl. No.: 14/273,771

(22) Filed: May 9, 2014

(65) Prior Publication Data
US 2015/0323613 A1    Nov. 12, 2015

(51) Int. Cl.
G01R 33/07    (2006.01)
H01L 43/04    (2006.01)
H01L 43/06    (2006.01)

(52) U.S. Cl.
CPC .............. G01R 33/077 (2013.01); H01L 43/04 (2013.01); H01L 43/065 (2013.01)

(58) Field of Classification Search
CPC ....................................................... G01R 33/07
USPC ........................................................ 324/251
See application file for complete search history.

(56) References Cited

U.S. PATENT DOCUMENTS

| 6,127,821 | A | 10/2000 | Ramsden et al. |
| 6,184,679 | B1 | 2/2001 | Popovic et al. |
| 7,782,050 | B2 | 8/2010 | Ausserlechner et al. |
| 7,872,322 | B2 | 1/2011 | Schott et al. |
| 8,922,207 | B2 | 12/2014 | Ausserlechner |
| 2010/0123458 | A1 | 5/2010 | Schott |
| 2010/0133632 | A1 | 6/2010 | Schott |
| 2010/0219810 | A1 | 9/2010 | Rocznik et al. |
| 2010/0219821 | A1 | 9/2010 | Rocznik et al. |
| 2013/0015853 | A1 | 1/2013 | Raz et al. |
| 2013/0021026 | A1 | 1/2013 | Ausserlechner |
| 2013/0127453 | A1 | 5/2013 | Ausserlechner |

(Continued)

FOREIGN PATENT DOCUMENTS

DE    10150955 C1    6/2003
EP    0143875 A1    6/1985

(Continued)

OTHER PUBLICATIONS

R.S. Popovic, "Hall Devices for Magnetic Sensor Microsystems", 1997 IEEE International Conference on Solid-State Sensors and Actuators, Chicago, Jun. 16-19, 1997, p. 377-380.

(Continued)

Primary Examiner — Bot Ledynh
(74) Attorney, Agent, or Firm — Eschweiler & Associates, LLC

(57) ABSTRACT

A vertical Hall effect device is provided and includes a Hall effect layer having a first, second, third, and fourth Hall effect region, which are at least partly decoupled from each other. The Hall effect layer has first and second opposite faces and the vertical Hall effect device has a terminal composition comprising a first, second, third and fourth terminal. A low ohmic connecting composition at the first face connects the terminal composition with contacts of the Hall effect regions so that at each Hall effect region the terminal composition is connected to a same first number of at least two contacts being connected to the respective Hall effect region at the first face. The second and third terminals selectively output an electrical signal responsive to a magnetic field, and the first and fourth terminals selectively output the electrical signal responsive to the magnetic field.

22 Claims, 17 Drawing Sheets

(56) References Cited

U.S. PATENT DOCUMENTS

2013/0214775 A1    8/2013    Ausserlechner et al.
2015/0323613 A1    11/2015    Ausserlechner

FOREIGN PATENT DOCUMENTS

| | | |
|---|---|---|
| EP | 2071347 A2 | 6/2009 |
| EP | 2192417 A2 | 6/2010 |
| EP | 2546670 A2 | 1/2013 |
| WO | 03036733 A2 | 5/2003 |
| WO | 2004025742 A1 | 3/2004 |

OTHER PUBLICATIONS

U.S. Appl. No. 14/273,807, filed May 9, 2014.
Notice of Allowance dated Aug. 15, 2014 for U.S. Appl. No. 13/298,917.
English translation of Chinese Office Action dated Jul. 11, 2014 for co-pending Chinese application No. 201210467043.1.
U.S. Appl. No. 13/753,195, filed Jan. 21, 2014.
Ex Parte Quayle Dated Jan. 21, 2016 U.S. Appl. No. 14/273,807.

US 9,316,705 B2

VERTICAL HALL EFFECT-DEVICE

TECHNICAL FIELD

Embodiments relate to a vertical Hall effect-device.

BACKGROUND

Hall devices are sensors that respond to a magnetic field. They typically suffer from offset error: the offset error is a non-vanishing output signal at zero applied magnetic field. Hall effect devices consist of one or several Hall effect regions with supply terminals and signal terminals. The Hall effect takes place in the Hall effect regions where the Lorentz force of the magnetic field on the moving charge carriers gives rise to a Hall electric field. The moving charge carriers are supplied by an electric power source which is connected to the supply terminals. At the signal terminals the output signal of the Hall effect device can be tapped. All terminals are ohmic contacts which makes the Hall effect device a purely resistive device. Vertical Hall devices (VHall) mainly respond to a magnetic field parallel to the surface of a substrate used for the fabrication of the respective vertical Hall device.

A number of different designs of vertical Hall devices are known, yet many of them are not apt for the so-called spinning current or spinning voltage method (or achieve only poor offset-cancelling performance) and suffer from low magnetic sensitivity and large electric fields. Typically, several contacts are placed on the surface of the substrate in such a way that current can flow in semicircles between two supply contacts while a sense contact is placed between these supply contacts and taps the Hall voltage that is generated by the current diving underneath the sense contact.

SUMMARY

A vertical Hall effect device is provided. The vertical Hall effect device comprises
  a Hall effect layer comprising at least a first Hall effect region, a second Hall effect region, a third Hall effect region and a fourth Hall effect region, which are at least partly decoupled from each other;
  wherein the Hall effect layer has a first face and a second opposite face;
  wherein the vertical Hall effect device has a terminal composition comprising a first terminal, a second terminal, a third terminal and a fourth terminal;
  wherein a low ohmic connecting composition at the first face connects the terminal composition with contacts of the Hall effect regions in such a way that at each Hall effect region the terminal composition is connected to a same first number of at least two contacts being connected to the respective Hall effect region at the first face;
  wherein the second terminal and the third terminal output an electrical signal responsive to a magnetic field, if an electrical energy is supplied to the first terminal and to the fourth terminal and wherein the first terminal and the fourth terminal output the electrical signal responsive to the magnetic field, if the electric energy is supplied to the second terminal and to the third terminal; and
  wherein a low ohmic layer composition having one or more layer portions; is arranged closer to the second face than to the first face, wherein the low ohmic layer composition connects each of the at least four Hall effect regions to at least one other of the at least four Hall effect regions.

BRIEF DESCRIPTION OF THE DRAWINGS

Embodiments of the present invention are described herein making reference to the appended drawings.

Figure 1:
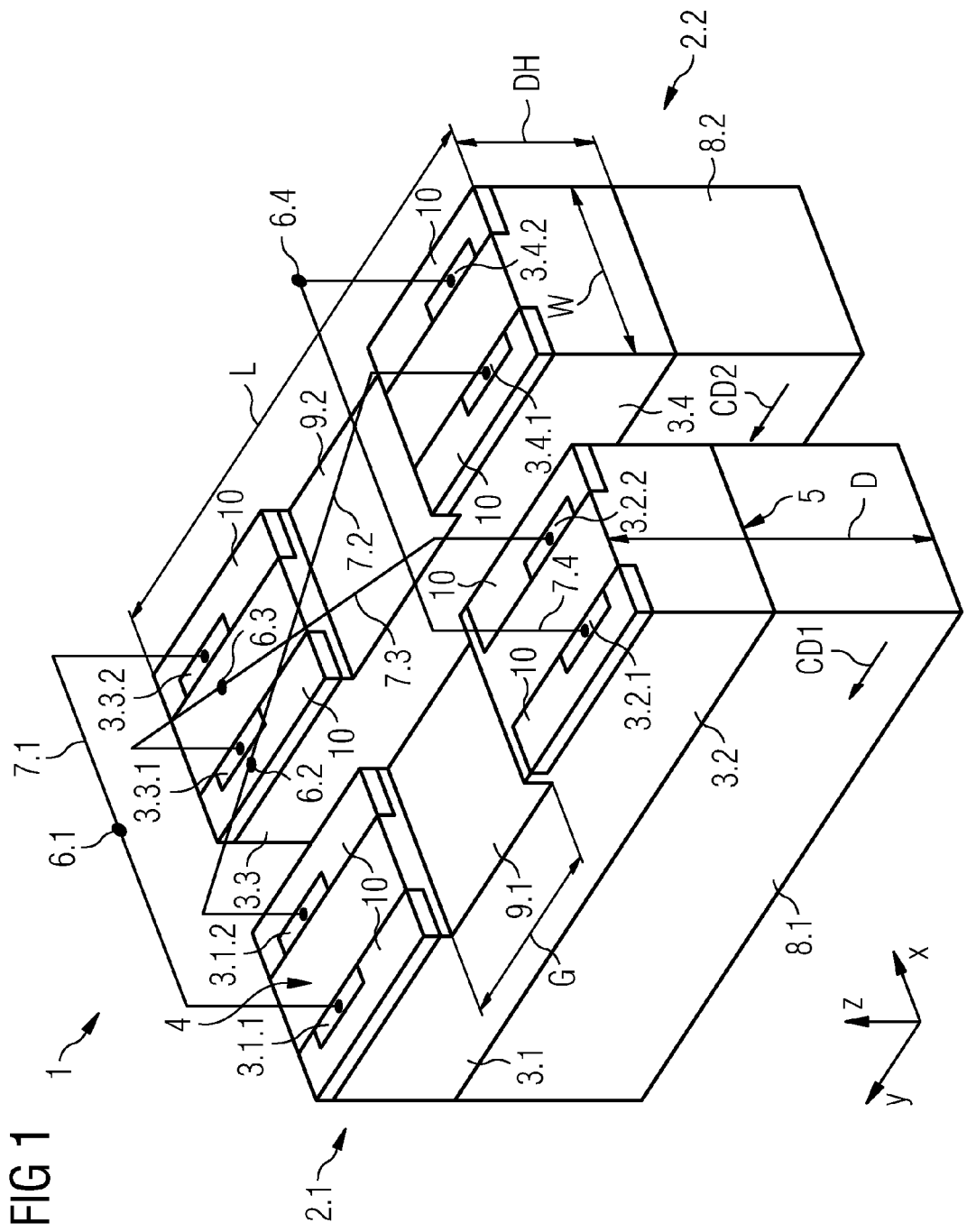
FIG. 1 shows a schematic, perspective view of a first embodiment of a vertical Hall device comprising four Hall effect regions, wherein each Hall effect region is connected by a first contact and a second contact.

Equal or equivalent elements or elements with equal or equivalent functionality are denoted in the following description by equal or equivalent reference numerals.

DETAILED DESCRIPTION

In the following description, a plurality of details is set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 2:
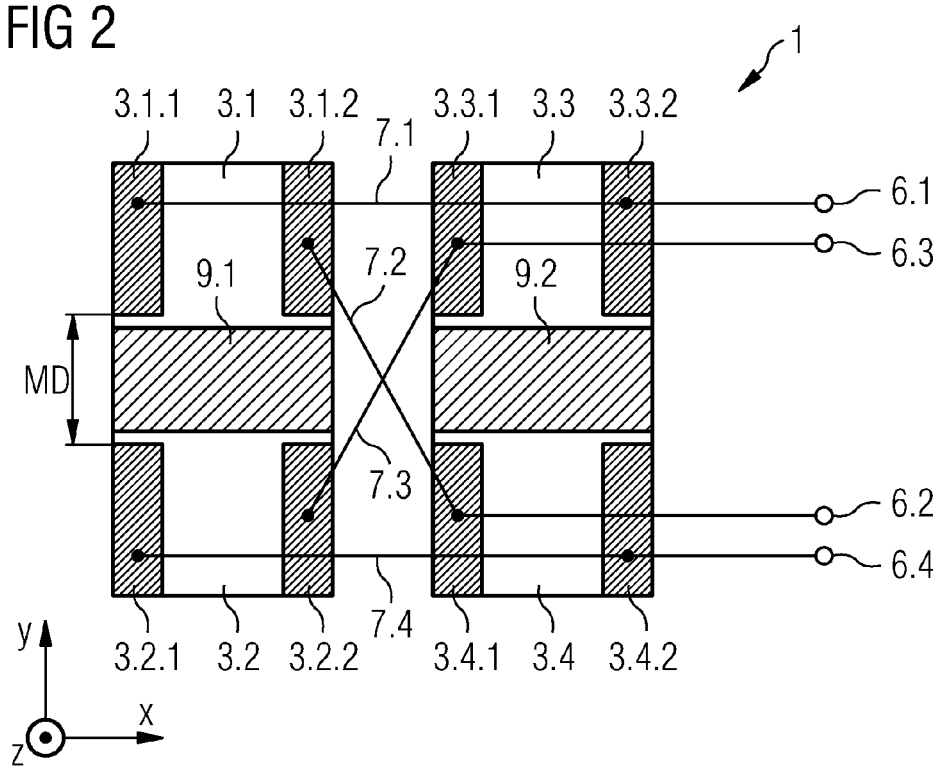
FIG. 2 shows a schematic top view of the first embodiment of the vertical Hall device comprising four Hall effect regions.

FIG. 1 shows a schematic, perspective view of a first embodiment of a vertical Hall device 1 comprising four Hall effect regions 3.1, 3.2, 3.3, 3.4, wherein each Hall effect region 3.1, 3.2, 3.3, 3.4 is connected by a first contact 3.1.1, 3.2.1, 3.3.1, 3.4.1 and a second contact 3.1.2, 3.2.2, 3.3.2, 3.4.2. Parts which do not conduct electrical current are not drawn (e.g. the empty space 9.1 is electrically isolating, e.g. a reverse biased pn-junction, and hence it is not drawn, because its physical composition is irrelevant for the invention as long as it does not conduct current. FIG. 2 shows a schematic top view of the first embodiment of the vertical Hall device 1 comprising four Hall effect regions 3.1, 3.2, 3.3, 3.4.

According to the first embodiment, the vertical Hall effect device 1 comprises: a Hall effect layer 2 comprising at least a first Hall effect region 3.1, a second Hall effect region 3.2, a third Hall effect region 3.3 and a fourth Hall effect region 3.4, which are at least partly decoupled from each other;
wherein the Hall effect layer 2 has a first face 4 and a second opposite face 5;
wherein the vertical Hall effect device 1 has a terminal composition 6.1, 6.2, 6.3, 6.4 comprising a first terminal 6.1, a second terminal 6.2, a third terminal 6.3 and a fourth terminal 6.4;
wherein a low ohmic connecting composition 7.1, 7.2, 7.3, 7.4 at the first face 4 connects the terminal composition 6.1, 6.2, 6.3, 6.4 with contacts of the Hall effect regions 3.1, 3.2, 3.3, 3.4 in such a way that at each Hall effect region 3.1, 3.2, 3.3, 3.4 the terminal composition 6.1, 6.2, 6.3, 6.4 is connected to a same first number of at least two contacts 3.1.1, 3.1.2, 3.2.1, 3.2.2, 3.3.1, 3.3.2, 3.4.1, 3.4.2 being connected to the respective Hall effect region 3.1, 3.2, 3.3, 3.4 at the first face 4;
wherein the second terminal 6.2 and the third terminal 6.3 output an electrical signal responsive to a magnetic field, if electrical energy is supplied to the first terminal 6.1 and to the fourth terminal 6.4 and wherein the first terminal 6.1 and the fourth terminal 6.4 output an electrical signal responsive to the magnetic field, if electric energy is supplied to the second terminal 6.2 and to the third terminal 6.3; and
wherein a low ohmic layer composition 8.1, 8.2 having one or more layer portions 8.1, 8.2; is arranged closer to the second face 5 than to the first face 4, wherein the low ohmic layer composition 8.1, 8.2 connects each of the at least four Hall effect regions 3.1, 3.2, 3.3, 3.4 to at least one other of the at least four Hall effect regions 3.1, 3.2, 3.3, 3.4.

In the first embodiment of a vertical Hall effect device 1 the Hall effect layer 2 comprises four Hall effect regions 3.1, 3.2, 3.3, 3.4. The first face 4 faces during the fabrication of the vertical Hall effect device 1 away from a raw substrate on which or in which the vertical Hall device 1 is to be formed, whereas the second face 5 faces during the fabrication of the vertical Hall effect device 1 towards the substrate. The readily fabricated Hall effect device 1 may be surrounded at least partly by a portion of the raw substrate. However, it is also possible to remove the raw substrate completely from the vertical Hall effect device 1. In the figures herein the Hall effect regions 3.1, 3.2, 3.3, 3.4 are shown in in a standalone manner for the sake of clarity. However, the Hall effect regions 3.1, 3.2, 3.3, 3.4 may be embedded in one or more substrates which may serve as an insulation.

The low ohmic connecting composition 7.1, 7.2, 7.3, 7.4 at the first face 4 connects the terminal composition 6.1, 6.2, 6.3, 6.4 with contacts of the Hall effect regions 3.1, 3.2, 3.3, 3.4 in such a way that at each Hall effect region 3.1, 3.2, 3.3, 3.4 the terminal composition 6.1, 6.2, 6.3, 6.4 is connected to a same first number of at least two contacts 3.1.1, 3.1.2, 3.2.1, 3.2.2, 3.3.1, 3.3.2, 3.4.1, 3.4.2 being connected to the respective Hall effect region 3.1, 3.2, 3.3, 3.4 at the first face 4, wherein the first number is 2.

The electrical energy fed to the terminal composition 6.1, 6.2, 6.3, 6.4 may be a current or a voltage. The electrical output signal may also be a current or a voltage.

The low ohmic connecting composition 7.1, 7.2, 7.3, 7.4 may be made by any available technology, such as by BiCMOS/CMOS-processes. The low ohmic connecting paths 7.1, 7.2, 7.3, 7.4 may have an elongated form or a laminar form. Further, the low ohmic connecting paths 7.1, 7.2, 7.3, 7.4 may be made of metal, such as aluminum or copper, of signal conductors, such as silicium, or of mixtures thereof. The low ohmic connection paths 7.1, 7.2, 7.3, 7.4 may connect more than one of the contacts 3.1.1, 3.1.2, 3.2.1, 3.2.2, 3.3.1, 3.3.2, 3.4.1, 3.4.2 to one of the terminals 6.1, 6.2, 6.3, 6.4.

In the first embodiment the low ohmic layer composition 8.1, 8.2 comprises a first layer portion 8.1, which connects the first Hall effect region 3.1 and the second Hall effect region 3.2, and a second layer portion 8.2, which connects the third Hall effect region 3.3 and the fourth Hall effect region 3.4.

As the second terminal 6.2 and the third terminal 6.3 output an electrical signal responsive to a magnetic field, if electrical energy is supplied to the first terminal 6.1 and to the fourth terminal 6.4 and as the first terminal 6.1 and the fourth terminal 6.4 output an electrical signal responsive to the magnetic field, if electric energy is supplied to the second terminal 6.2 and to the third terminal 6.3, the vertical Hall effect device 1 is highly symmetric and can be operated in a spinning scheme to greatly reduce offset errors.

The combination of the low ohmic connecting composition 7.1, 7.2, 7.3, 7.4 at the first face 4 and the low ohmic layer composition 8.1, 8.2 having one or more layer portions 8.1, 8.2; is arranged closer to the second face 5 than to the first face 4, reduces ohmic losses within the device 1, so that the device 1 has a large voltage related or current related magnetic sensitivity and smaller offset error. Furthermore, self-heating of the vertical Hall device 1 may be reduced by smaller ohmic losses. Moreover, a smooth temperature distribution within the vertical Hall device 1 may be achieved, so that inhomogeneities of the conductivity are reduced and thermo-magnetic effects, such as the Seebeck effect, the Peltier effect and the Thompson effect are minimized.

In a preferred embodiment the low ohmic connecting composition 7.1, 7.2, 7.3, 7.4 comprises a low ohmic wiring composition 7.1, 7.2, 7.3, 7.4. In this case, the low ohmic connecting paths 7.1, 7.2, 7.3, 7.4 have an elongated form.

In a preferred embodiment the low ohmic connecting composition 7.1, 7.2, 7.3, 7.4 connects the contacts 3.1.1, 3.1.2, 3.2.1, 3.2.2, 3.3.1, 3.3.2, 3.4.1, 3.4.2 and the terminals 6.1, 6.2, 6.3, 6.4 in such a way that each of the contacts 3.1.1, 3.1.2, 3.2.1, 3.2.2, 3.3.1, 3.3.2, 3.4.1, 3.4.2 is connected to exactly one of the terminals 6.1, 6.2, 6.3, 6.4. By these features the sensitivity of the vertical Hall effect device 1 may be enhanced and offset errors may be further reduced.

In a preferred embodiment the low ohmic connecting composition 7.1, 7.2, 7.3, 7.4 connects the contacts 3.1.1, 3.1.2, 3.2.1, 3.2.2, 3.3.1, 3.3.2, 3.4.1, 3.4.2 and the terminals 6.1, 6.2, 6.3, 6.4 in such a way that each of the four terminals 6.1, 6.2, 6.3, 6.4 is connected to a same second number of contacts 3.1.1, 3.1.2, 3.2.1, 3.2.2, 3.3.1, 3.3.2, 3.4.1, 3.4.2, wherein the second number is two in the first embodiment shown in FIGS. 1 and 2 as each of the four terminals 6.1, 6.2, 6.3, 6.4 is connected to two of the contacts 3.1.1, 3.1.2, 3.2.1, 3.2.2, 3.3.1, 3.3.2, 3.4.1, 3.4.2. By these features offset errors may be further reduced.

In a preferred embodiment the low ohmic connecting composition 7.1, 7.2, 7.3, 7.4 connects the contacts 3.1.1, 3.1.2, 3.2.1, 3.2.2, 3.3.1, 3.3.2, 3.4.1, 3.4.2 and the terminals 6.1, 6.2, 6.3, 6.4 in such a way that each of the four terminals 6.1, 6.2, 6.3, 6.4 is connected to contacts 3.1.1, 3.1.2, 3.2.1, 3.2.2, 3.3.1, 3.3.2, 3.4.1, 3.4.2 of a same third number of different Hall effect regions 3.1, 3.2, 3.3, 3.4. In case of the first embodiment shown in FIGS. 1 and 2 the third number is two as each of the four terminals 6.1, 6.2, 6.3, 6.4 is connected to contacts 3.1.1, 3.1.2, 3.2.1, 3.2.2, 3.3.1, 3.3.2, 3.4.1, 3.4.2 of two different Hall effect regions 3.1, 3.2, 3.3, 3.4. By these features offset errors may be further reduced.

In a preferred embodiment each of the at least four Hall effect regions 3.1, 3.2, 3.3, 3.4 is connected at the first face 4 to a first contact 3.1.1, 3.2.1, 3.3.1, 3.4.1 and to a second contact 3.1.2, 3.2.2, 3.3.2, 3.4.2, wherein the low ohmic connecting composition 7.1, 7.2, 7.3, 7.4 is arranged in such a way, that the first terminal 6.1 is connected to the first contact 3.1.1 of the first Hall effect region 3.1 and to the second contact 3.3.2 of the third Hall effect region 3.3, that the second terminal 6.2 is connected to the second contact 3.1.2 of the first Hall effect region 3.1 and to the first contact 3.4.1 of the fourth Hall effect region 3.4, that the third terminal 6.3 is connected to the second contact 3.2.2 of the second Hall effect region and to the first contact 3.3.1 of the third Hall effect region 3.3 and that the fourth terminal 6.4 is connected to the first contact 3.2.1 of the second Hall effect region 3.2 and to the second contact 3.4.2 of the fourth Hall effect region 3.4. By these features offset errors may be further reduced.

In a preferred embodiment the low ohmic layer composition 8.1, 8.2 is arranged in such a way, that the entire second faces of the Hall effect regions 3.1, 3.2, 3.3, 3.4 are in ohmic contact with the low ohmic layer composition 8.1, 8.2. By these features the ohmic losses within the vertical Hall device 1 may be further reduced, the magnetic sensitivity is further increased and offset error is further reduced.

In a preferred embodiment the low ohmic layer composition 8.1, 8.2 comprises a first layer portion 8.1 connecting the first Hall effect region 3.1 and the second Hall effect region 3.2, and wherein the low ohmic layer composition 8.1, 8.2 comprises a second layer portion 8.2 connecting the third Hall effect region 3.3 and the fourth Hall effect region 3.4. By these features offset errors may be further reduced and magnetic sensitivity may be further increased.

In a preferred embodiment the first Hall effect region 3.1 and the second Hall effect region 3.2 are arranged in such a way that they are sensitive to magnetic fields having a first common direction CD1, and wherein the third Hall effect region 3.3 and the fourth Hall effect region 3.4 are arranged in such a way that they are sensitive to magnetic fields having a second common direction CD2 different from the first direction CD1. By these features offset errors may be further reduced and the magnetic sensitivity may be further increased (e.g. due to averaging over different directions of the semiconductor single crystal).

In a preferred embodiment the first common direction CD1 and the second common CD2 direction are identical. By these features the magnetic sensitivity may be further increased.

In a preferred embodiment the first Hall effect region 3.1 and the second Hall effect region 3.2 are arranged in a first row, wherein the third Hall effect region 3.3 and the fourth Hall effect region 3.4 are arranged in a second row being parallel to the first row, wherein the first Hall effect region 3.1 and the third Hall effect region 3.3 are facing each other, and wherein the second Hall effect region 3.2 and the fourth Hall effect region 3.4 are facing each other. By these features the low ohmic connecting composition 7.1, 7.2, 7.3, 7.4 and the low ohmic layer composition 8.1, 8.2 may be kept small so that the ohmic losses within the vertical Hall device 1 may be further reduced and the magnetic sensitivity may be further increased.

In a preferred embodiment the first Hall effect region 3.1, the second Hall effect region 3.2, the third Hall effect region 3.3 and the fourth Hall effect region 3.4 are arranged in a common row. By these features a large cross-section of a magnetic field may be sensed and it is more efficient to align all Hall effect regions close nearby a single wire, that can generate a test magnetic field.

In a preferred embodiment at least two of the Hall effect regions 3.1, 3.2, 3.3, 3.4 are decoupled by a minimum distance MD in a top view between the contacts 3.1.1, 3.1.2, 3.2.1, 3.2.2 or 3.3.1, 3.3.2, 3.4.1, 3.4.2 of the two Hall effect regions 3.1, 3.2 or 3.3, 3.4, respectively, greater than half of the depth DH of the Hall effect regions 3.1, 3.2, 3.3, 3.4, by a reverse biased pn-junction and/or by a trench-wall coated with an insulating dielectric thin film.

In some embodiments low ohmic is defined as: having an electrical conductivity which is at least 10 times, preferred at least 30 times, more preferred at least 100 times, of the conductivity of the Hall effect region 3.1, 3.2, 3.3, 3.4.

The vertical Hall effect device may comprise two identical portions, each one with four contacts 3.1.1, 3.1.2, 3.2.1, 3.2.2 or 3.3.1, 3.3.2, 3.4.1, 3.4.2 respectively as shown in FIGS. 1 and 2.

Each portion may be rectangular with length (e.g. L=30 µm), width (e.g. W=7.9 µm), depth (e.g. D=12 µm). The lower part may comprise a low ohmic (highly conductive) buried layer composition 8.1, 8.2 or any other low ohmic layer composition, whereas the upper part of depth (e.g. DH=6 µm) may comprise the less conductive Hall effect layer 2.1, 2.2. The low ohmic layer 8.1, 8.2 and the Hall effect layer 2.1, 2.2 may be of the same type of conductivity, preferably of the n-type conductivity. The Hall effect layer 2.1, 2.2 of each portion may be at least partially split in two Hall effect regions 3.1, 3.2 and 3.3, 3.4 by a respective decoupling portion 9.1, 9.2 that extends over a length (e.g. G=10 μm) along the length direction. These portions 9.1, 9.2 each may be a reverse biased well of opposite conductivity type than the Hall effect layer 2.1, 2.2. It can be shallow like (e.g. 1 μm deep as shown in the figure) or it can be deep (reaching down through the entire Hall effect layer up to the respective buried layer composition 8.1, 8.2). The decoupling portions 9.1, 9.2 should be designed such that a major part of the current flows into the deep regions of the Hall effect regions 3.1, 3.2, 3.3, 3.4—i.e. it should prevent lateral current flow near the first face 4 between the contact pair 3.1.1, 3.1.2 of the first Hall effect region 3.1 and the opposite contact pair 3.2.1, 3.2.2. In the same way it should prevent lateral current flow near the first face 4 between the contact pair 3.3.1, 3.3.2 of the third Hall effect region 3.3 and the opposite contact 3.4.1, 3.4.2 of the fourth Hall effect region 3.4. In other words: the decoupling portions 9.1, 9.2 should prevent current flow between different Hall effect regions near the first face 4. One preferred mode of operating is that current flows in the first part of the vertical Hall device 1 into 3.1.1 or 3.1.2 down to the buried layer portion 8.1, then along the y-direction in the buried layer portion 8.1 and finally up to 3.2.1 or 3.2.2 or vice versa and that current flows in the second part of the vertical Hall device 1 into 3.3.1 or 3.3.2 down to the buried layer portion 8.2, then along the y-direction in the buried layer portion 8.1 and finally up to 3.4.1 or 3.4.2 or vice versa.

The contacts 3.1.1, 3.1.2, 3.2.1, 3.2.2, 3.3.1, 3.3.2, 3.4.1, 3.4.2 may be made by highly doped or implanted n+S/D diffusions or implantations. They are shallow (e.g. 0.2 μm deep) with a dose of $10^{20}/cm^3$ or even higher. They can be surrounded by tubs 10, for example by larger nwell tubs 10, which are deeper (e.g. 0.7 μm deep) and have less doping concentration (e.g. $10^{17}/cm^3$). The Hall effect layer may have even less doping concentration (e.g. $10^{16}/cm^3$ or less). The tubs 10 are optional.

Each contact 3.1.1, 3.1.2, 3.2.1, 3.2.2, 3.3.1, 3.3.2, 3.4.1, 3.4.2 may be rectangular (which also includes square). The contacts 3.1.1, 3.1.2, 3.2.1, 3.2.2, 3.3.1, 3.3.2, 3.4.1, 3.4.2 may be aligned in a first direction (which is the x-direction in the figures) and they are spaced apart in a second direction (which is the y-direction). Consequently the device 1 is sensitive to magnetic fields in the second direction. It is advantageous if the contacts 3.1.1, 3.1.2, 3.2.1, 3.2.2, 3.3.1, 3.3.2, 3.4.1, 3.4.2 are close to the side walls of the respective Hall effect region 3.1, 3.2, 3.3, 3.4 at all four edges of their perimeter except the one which faces the other contact of the same Hall effect region 3.1, 3.2, 3.3, 3.4. Then the current flowing into the depth below the respective contact 3.1.1, 3.1.2, 3.2.1, 3.2.2, 3.3.1, 3.3.2, 3.4.1, 3.4.2 is confined by three sides and it can only make a bow below the other contact 3.1.1, 3.1.2, 3.2.1, 3.2.2, 3.3.1, 3.3.2, 3.4.1, 3.4.2 of the same Hall effect region 3.1, 3.2, 3.3, 3.4, thereby generating a Hall effect signal. The spacing between contacts 3.1.1, 3.1.2, 3.2.1, 3.2.2, 3.3.1, 3.3.2, 3.4.1, 3.4.2 of the same Hall effect region 3.1, 3.2, 3.3, 3.4 depends on the depth DH: it should be smaller or comparable to DH. The extension of the contacts along the x-direction should be small.

One feature may be the connection of two identical portions, wherein the first portion comprises the Hall effect regions 3.1 and 3.2 and wherein the second portion comprises the Hall effect regions 3.3 and 3.4 (note that in the figures one can note that there are small differences between the two portions; these differences are introduced in order to model offset errors caused by small asymmetries; so strictly speaking the two portions are nominally identical yet in practice they inevitably differ slightly due to mismatch caused by process tolerances): Contact 3.1.1 may be shorted to contact 3.3.2, which are both connected by a first low ohmic connection path 7.1 to a first terminal 6.1, contact 3.1.2 may be shorted to contact 3.4.1, which are both connected by a second low ohmic connection path 7.2 space to a second terminal 6.2, contact 3.2.2 may be shorted to contact 3.3.1, which are both connected by a third ohmic connection path 7.3 to a third terminal T3, contact 3.2.1 may be shorted to contact 3.4.2, which are both connected by the fourth low ohmic connection path 7.4 to a fourth terminal 6.4. This connection path 7.1, 7.2, 7.3, 7.4 may be done by interconnect layers in the semiconductor technology such as metal 1 or metal 2 or higher metal layers. These are also called wires. They can also be made of poly-silicon or other material with low impedance. The series connection consisting of a wire plus an n+S/D-diffusion plus optional nwell-tub plus Hall effect region plus buried layer is ohmic, which means that for small voltages in the order of 10 mV to 100 mV the current scales linearly with the voltage drop regardless of the polarity. Note that the two buried layer portions 8.1 and 8.2 are not directly connected to each other (they are separate). Note also that two contacts are shorted to a terminal, whereby one of these two contacts belongs to the first portion and the other to the second portion.

Figure 3:
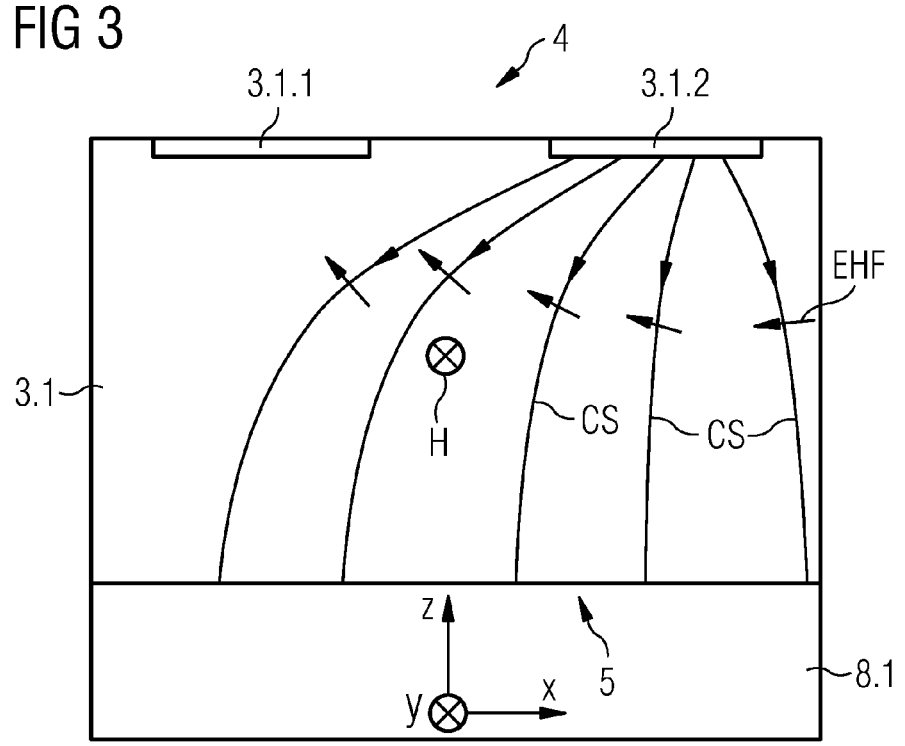
FIG. 3 schematically illustrates an electric field and current streamlines within a Hall effect region exposed to a magnetic field when an electric current is fed to the second contact at a first face of the Hall effect region and extracted at a low ohmic layer composition arranged closer to an opposite second face than to the first face of the Hall effect region.

FIG. 3 schematically illustrates an electric field and current streamlines within a Hall effect region 3.1 exposed to a magnetic field H when an electric current is fed to the second contact 3.1.2 at a first face 4 of the Hall effect region 3.1 and extracted at a low ohmic layer portion 8.1 arranged closer to an opposite second face 5 than to the first face 4 of the Hall effect region 3.1.

For the purpose of explaining how a Hall signal is generated one only need to consider one of the Hall effect regions 3.1, 3.2, 3.3, 3.4: supposed that contact 3.1.2 is at high potential (=positive supply terminal), contact 3.1.1 is floating (=sense terminal), and the low ohmic layer portion 8.1 is at low electric potential. Then the current streamlines CS as schematically illustrated in FIG. 3 will result. Some of the current streamlines CS flow in substantially vertical direction down from contact 3.1.2 to the highly conductive low ohmic layer portion 8.1: they are less efficient for the Hall signal. Other current streamlines flow in arcs from contact 3.1.2 to the left underneath contact 3.1.1 and down to the low ohmic layer portion 8.1: these current streamlines are more important for the Hall signal that can be sensed at contact 3.1.1. Due to the Lorenz force on the charge carriers exerted by the magnetic field H, an electric Hall field EHF establishes that is perpendicular to the current streamlines CS. This electric Hall field EHF pulls the electric potential at contact 3.1.1 up or down, depending on the polarity of the magnetic field H. Without loss of generality one may assume that the electric potential at contact 3.1.1 falls if contact 3.1.1 is at the right side of the current streamlines CS when the magnetic field H points into the drawing plane, where the right side is referred to the direction when one moves with the current streamlines CS.

Figure 4:
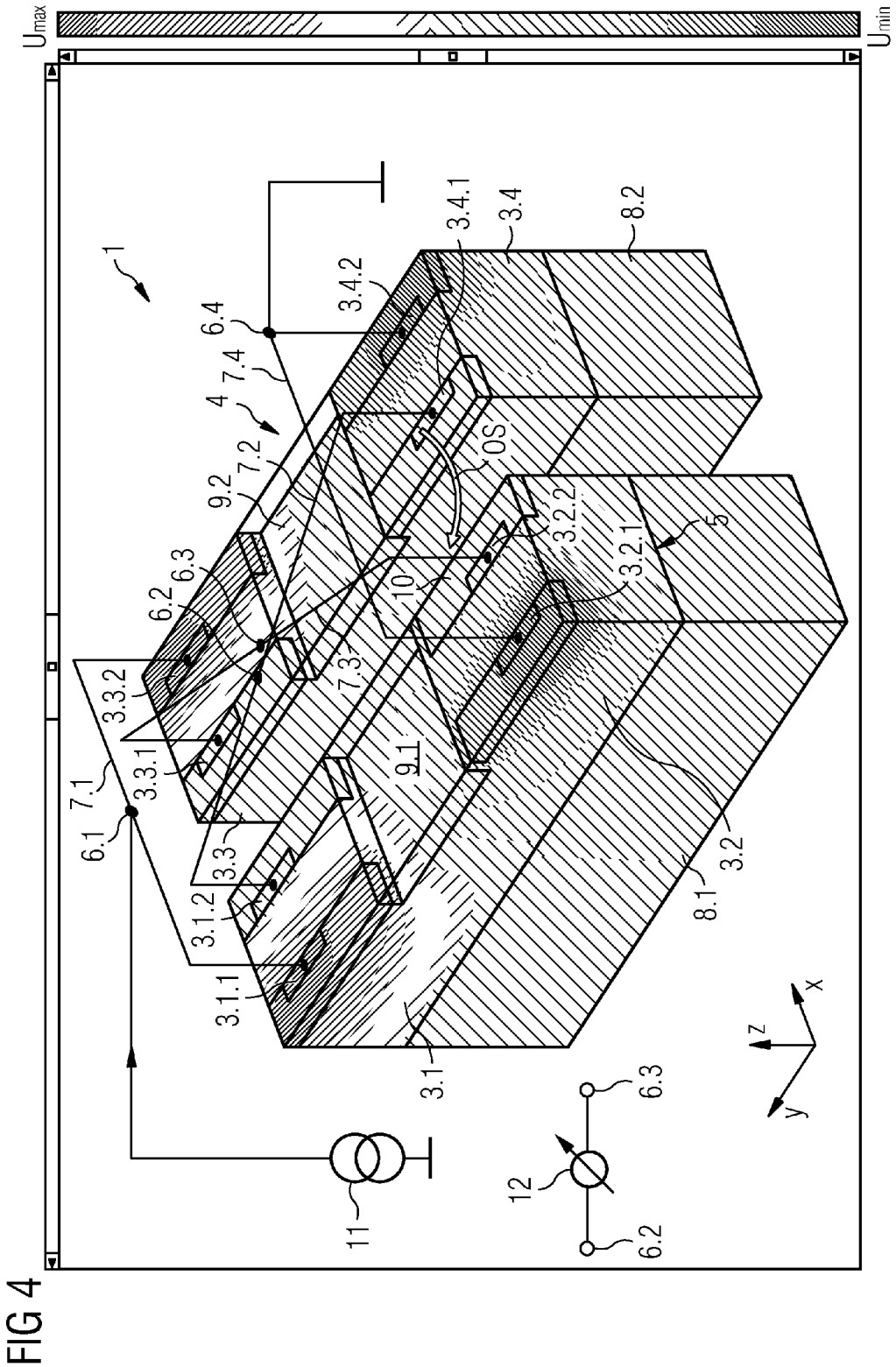
FIG. 4 shows in a perspective view a result of a numerical simulation of the electric potential in the first embodiment of the vertical Hall device, when the vertical Hall device is used in a first mode of operation.

FIG. 4 shows in a perspective view a result of a numerical simulation of the electric potential in the first embodiment of the vertical Hall device 1, when the vertical Hall device 1 is used in a first mode of operation.

In a preferred embodiment the terminals 6.1, 6.2, 6.3, 6.4 of the vertical Hall effect device 1 are connected to an energy supply and measuring circuit 11, 12 being configured in such a way that in a first mode of operation the first terminal 6.1 and the third terminal 6.3 are used to supply the Hall effect regions 3.1, 3.2, 3.3, 3.4 with the electrical energy, and the second terminal 6.2 and the fourth terminal 6.4 are used for tapping the electrical Hall output signal OS responsive to the magnetic field H. In the first embodiment as shown in FIG. 4 the energy supply and measuring circuit 11, 12 comprises an energy supply circuit 11 and a measuring circuit 12, wherein the energy supply circuit 11 is connected to the terminals 6.1 and 6.4, and wherein the measuring circuit 12 is connected to the terminals 6.2 and 6.3 during the first mode of operation.

Figure 5:
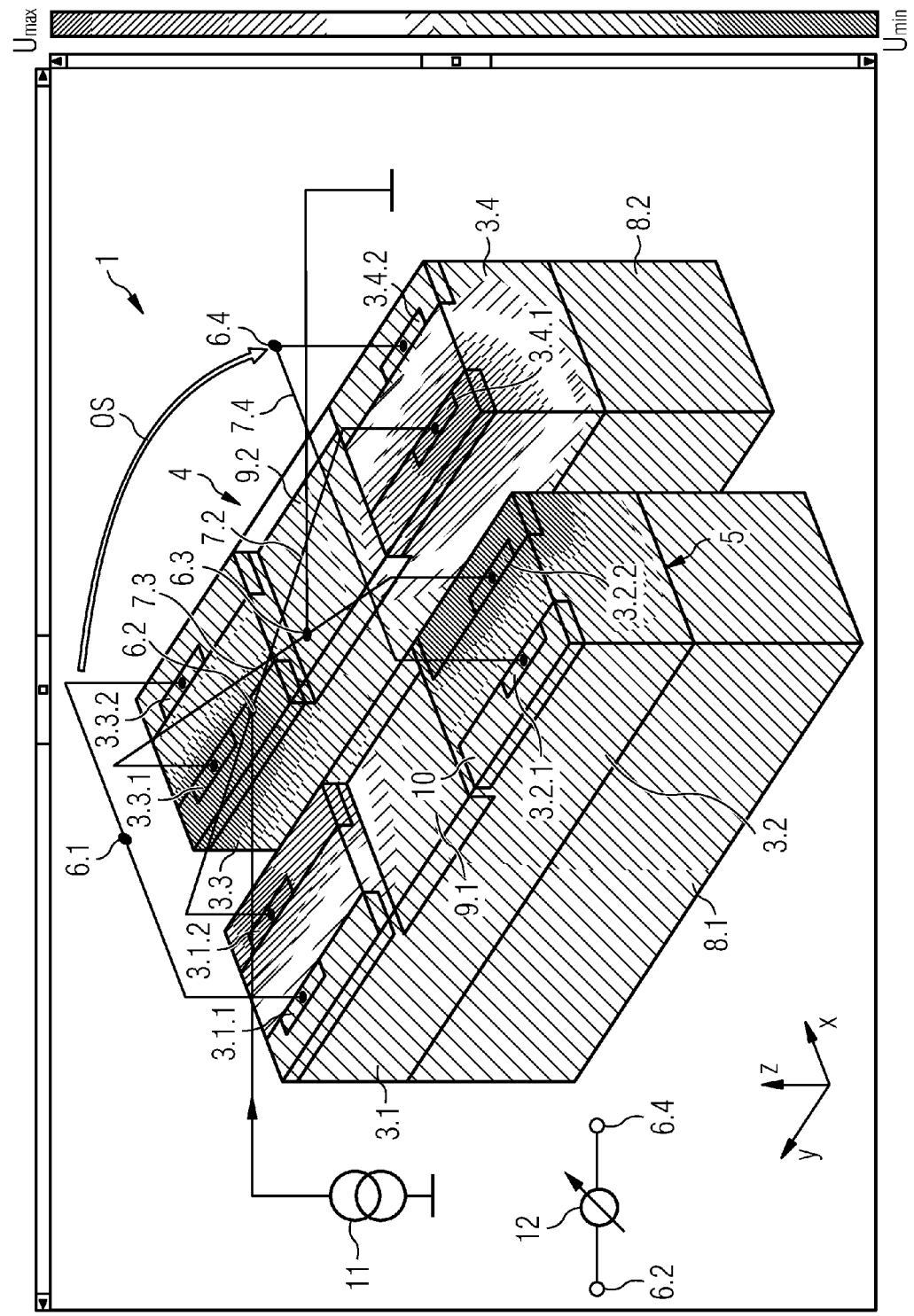
FIG. 5 shows in a perspective view a result of a numerical simulation of the electric potential in the first embodiment of the vertical Hall device, when the vertical Hall device is used in a second mode of operation.

FIG. 5 shows in a perspective view a result of a numerical simulation of the electric potential in the first embodiment of the vertical Hall device 1, when the vertical Hall device 1 is used in a second mode of operation.

In a preferred embodiment the terminals 6.1, 6.2, 6.3, 6.4 of the vertical Hall effect device 1 are connected to an energy supply and measuring circuit 11, 12 being configured in such a way that in a second mode of operation the second terminal 6.2 and the fourth terminal 6.4 are used to supply the Hall effect regions 3.1, 3.2, 3.3, 3.4 with the electrical energy, and the third terminal 6.3 and the first terminal 6.1 are used for tapping the electrical Hall output signal OS responsive to the magnetic field H. In the first embodiment as shown in FIG. 5 the energy supply and measuring circuit 11, 12 comprises an energy supply circuit 11 and a measuring circuit 12, wherein the energy supply circuit 11 is connected to the terminals 6.2 and 6.3, and wherein the measuring circuit 12 is connected to the terminals 6.1 and 6.4 during the second mode of operation.

In a preferred embodiment the energy supply and measuring circuit 11, 12 is configured to execute a measuring cycle having at least a first phase in which the device 1 operates in one of said modes of operations and a second phase in a different one of said modes of operations and derives a signal from combining the signals measured in first and second phase.

The device 1 can be operated in a spinning scheme which comprises two operating phases: in a first operating phase the terminals 6.1 and 6.4 are supply terminals, which means that they are connected to voltage or current supplies, while the terminals 6.2 and 6.3 are signal terminals, which means that the output signal OS of the vertical Hall effect regions is tapped at these terminals 6.2 and 6.3. In a second operating phase the terminals 6.2 and 6.3 are supply terminals and the terminals 6.1 and 6.4 are signal terminals. Finally the output signal OS of both operating phases are combined to give a total output, which has greatly reduced offset error (=zero point error).

Note that in general current flows over the wires that short two contacts at a signal terminal: e.g. in operating phase one terminal 6.2 is a signal terminal and contacts C2 and C4' are connected to T2 and there is a current flowing in the wire between 3.1.2 and 3.4.1.

Figure 6:
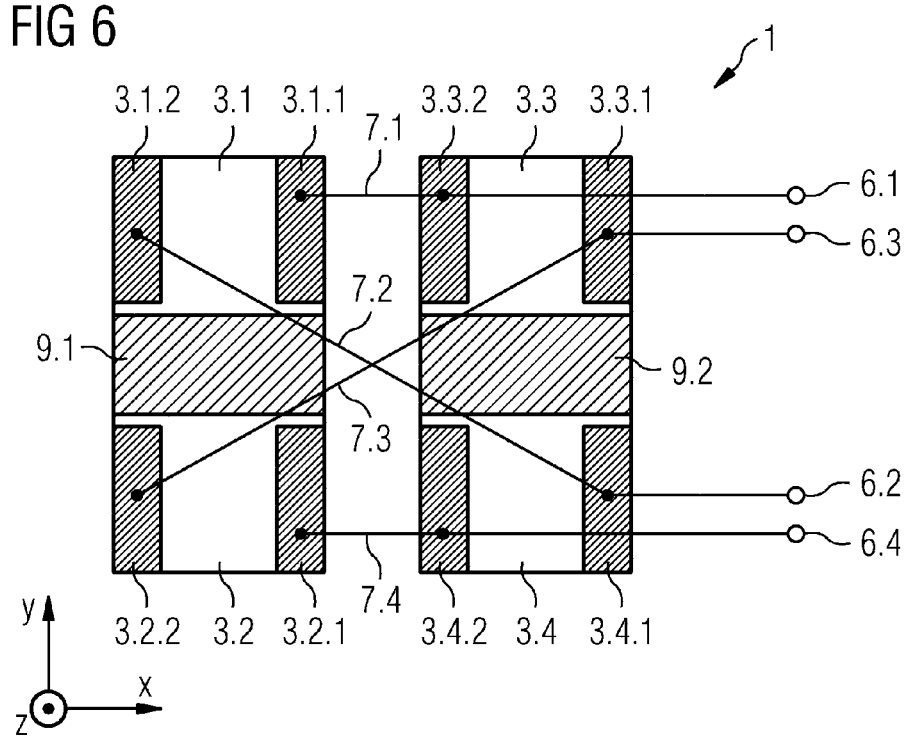
FIG. 6 shows a schematic top view of a second embodiment of the vertical Hall device.

FIG. 6 shows a schematic top view of a second embodiment of the vertical Hall device. The second embodiment may be derived from the first embodiment by rearranging the contacts 3.1.1, 3.1.2, 3.2.1, 3.2.2, 3.3.1, 3.3.2, 3.4.1, 3.4.2 and the low ohmic connecting composition 7.1, 7.2, 7.3, 7.4 of the device 1. The second embodiment may have all of the features discussed in context with the first embodiment.

Figure 7:
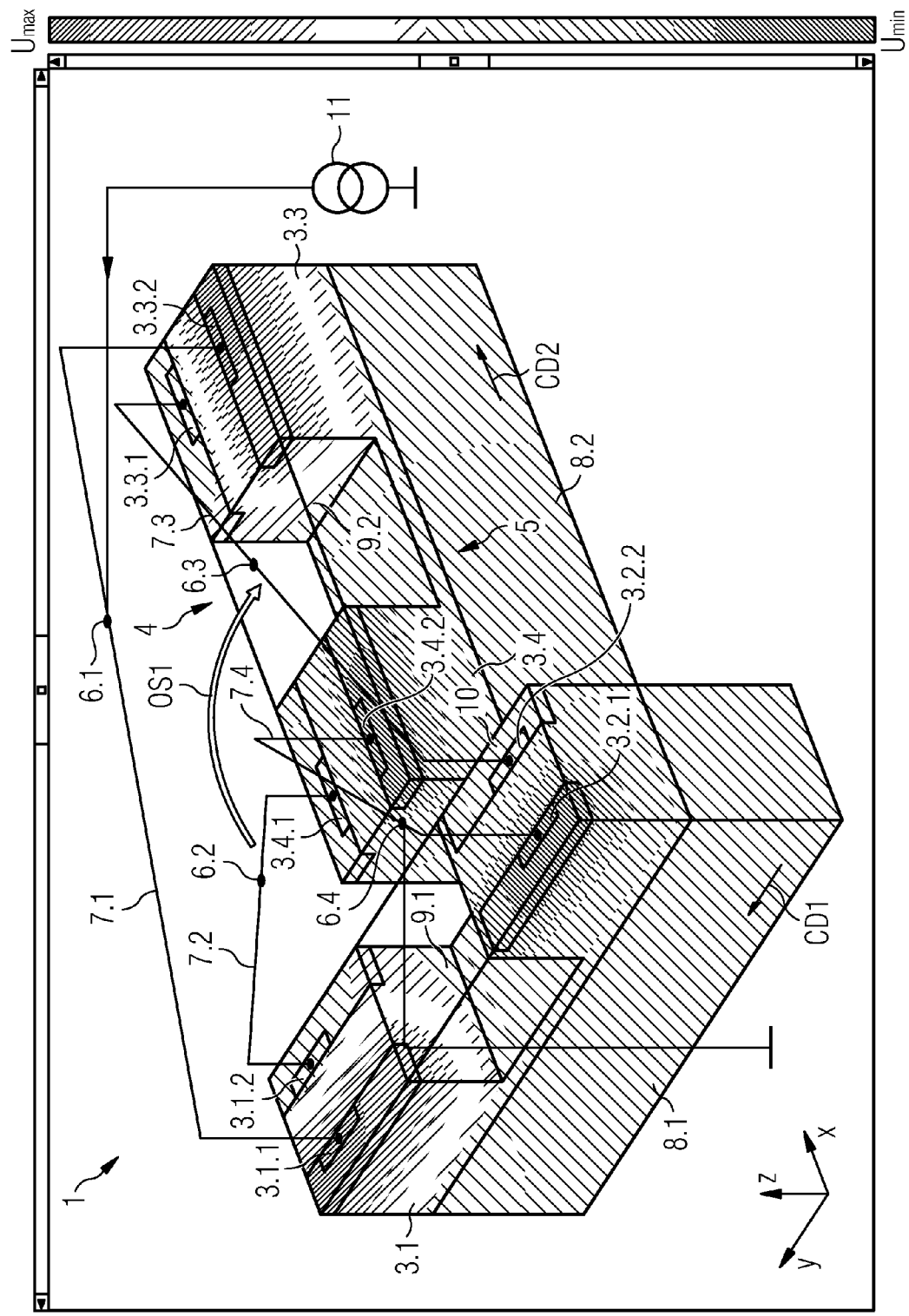
FIG. 7 shows in a perspective view a result of a numerical simulation of the electric potential in a third embodiment of a vertical Hall device, when the vertical Hall device is used in a first mode of operation.

FIG. 7 shows in a perspective view a result of a numerical simulation of the electric potential in a third embodiment of a vertical Hall device 1, when the vertical Hall device 1 is used in a first mode of operation.

Figure 8:
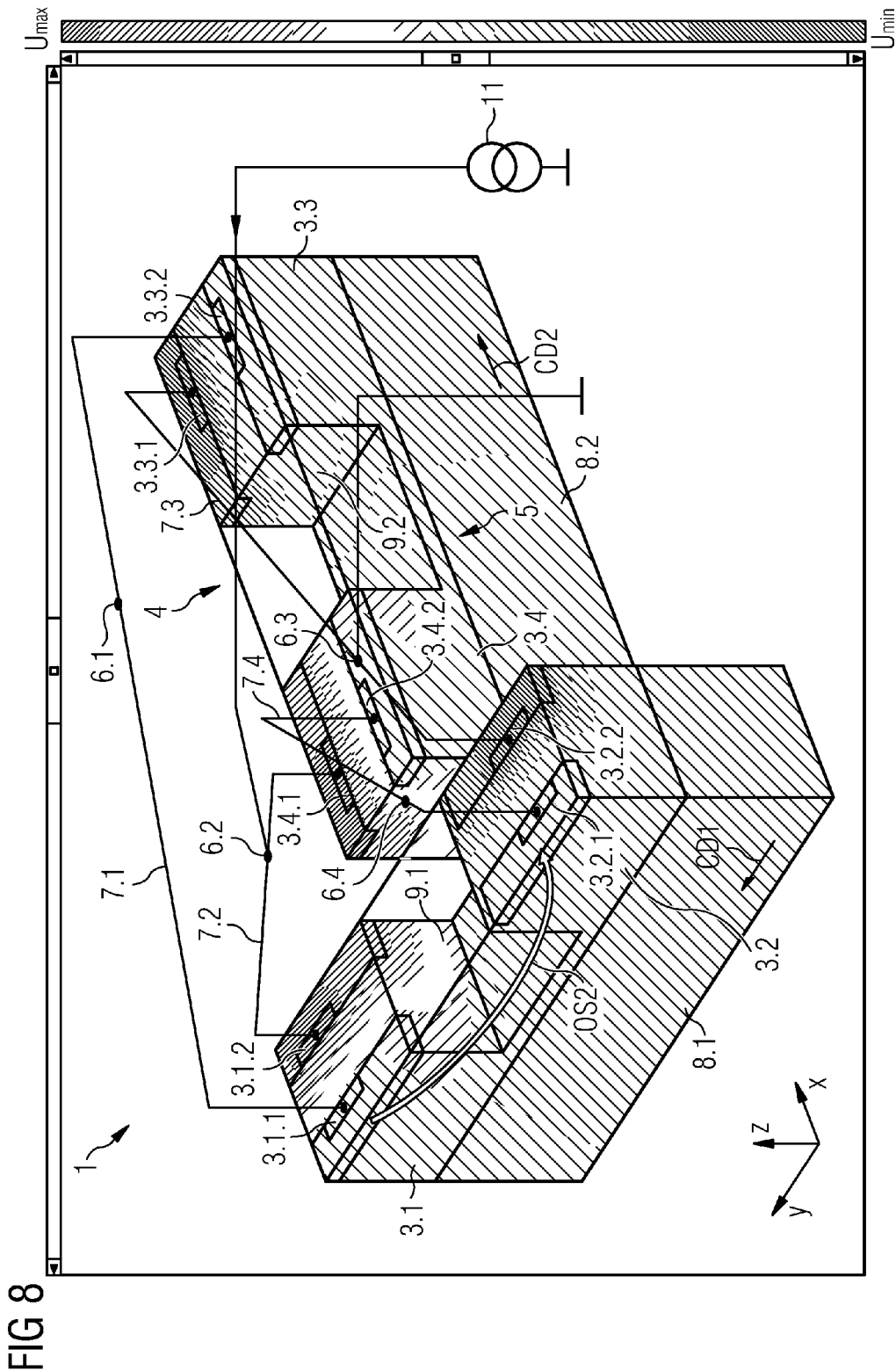
FIG. 8 shows in a perspective view a result of a numerical simulation of the electric potential in the third embodiment of the vertical Hall device, when the vertical Hall device is used in a second mode of operation.

FIG. 8 shows in a perspective view a result of a numerical simulation of the electric potential in the third embodiment of the vertical Hall device 1, when the vertical Hall device 1 is used in a second mode of operation.

The third embodiment is based on the first embodiment as described above. In the following only the differences will be discussed. The third embodiment may have all of the features of the other embodiments as long as not stated otherwise and not visible in the respective figures.

In some embodiments the first Hall effect region 3.1 and the second Hall effect region 3.2 are arranged in such a way that they are sensitive to magnetic fields having a first common direction CD1, and wherein the third Hall effect region 3.3 and the fourth Hall effect region 3.4 are arranged in such a way that they are sensitive to magnetic fields having a second common direction CD2. These features allow to sense magnetic fields having different directions.

In some embodiments the first common direction CD1 and the second common direction CD2 are perpendicular with respect to each other. A possible advantage of this arrangement may be simply to have more flexibility to place and route the devices in a densely populated layout of a sensor chip.

The total signal "output voltage OS in operating phase 1 minus output voltage OS in operating phase 2" responds to Hx+Hy, wherein Hx is the component of the magnetic field in the x-direction and Hy is the component of the magnetic field is that y-direction. One can construct a device that responds to Hx-Hy, too. To this end it has to be remembered how the Hx+Hy-device out of the pure Hy-device has been obtained: the right portion was rotated clockwise and kept all wires unchanged. Now the right portion may be simply rotated counter-clockwise and all wires may be kept unchanged: then it responds to −Hx−Hy. Alternatively one could start from the original Hy-device and rotate the left portion clockwise: the total signal (OS1−OS2)/2 becomes proportional to −Hx+Hy. If one starts from the original Hy-device and rotate the left portion counter-clockwise the signal becomes proportional to Hx+Hy. So depending on which one of the two devices is rotated by 90° the direction of maximum sensitivity can be designed for +/−45° or +/−135° (w.r.t. the positive x-axis).

In the three-dimensional drawings of FIGS. 1, 4, 5 a moderate decoupling is shown: the p-wells 9.1, 9.2 are not very deep and wide. In such a case it would be possible to skip the buried layer, because the current may flow from one Hall effect region 3.1 to the other Hall effect region 3.2 underneath the decoupling portion 9.1. This however would result in greatly reduced magnetic sensitivity (e.g. 3 times smaller), yet it would still work in principle. If the decoupling is perfect, which means that the p-well separates the Hall effect regions 3.1 from 3.2 and 3.3 from 3.4 completely, so that they are coupled only via the wires between contacts, the vertical Hall effect device 1 would not work without highly conductive short at the bottom of both Hall effect regions 3.1 and 3.2 as well as a highly conductive short at the bottom of both Hall effect regions 3.3 and 3.4 (such as n-type buried layers (nBLs)). The vertical Hall effect device of FIGS. 7, 8 shows a nearly perfect decoupling, because the decoupling portion reaches deep into the Hall-effect region, nearly cutting it completely off. In this case the performance of the device would be severely degraded (i.e. the voltage related magnetic sensitivity would decline by at least one order in magnitude) if the buried layer 8.1 would be missing.

Figure 9:
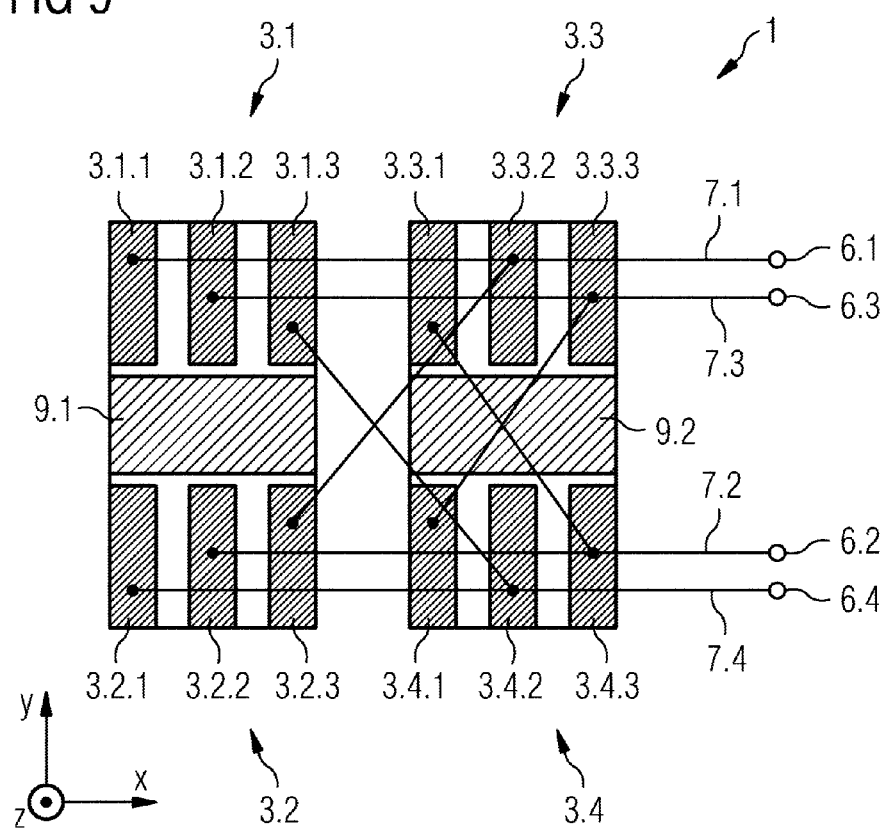
FIG. 9 shows a schematic top view of a fourth embodiment of a vertical Hall device, wherein each Hall effect region is connected at the first face by a first contact, a second contact and a third contact.

FIG. 9 shows a schematic top view of a fourth embodiment of a vertical Hall device 1, wherein each Hall effect region 3.1, 3.2, 3.3, 3.4 is connected at the first face 4 by a first contact 3.1.1, 3.2.1, 3.3.1, 3.4.1, a second contact 3.1.2, 3.2.2, 3.3.2, 3.4.2 and a third contact 3.1.3, 3.2.3, 3.3.3, 3.4.3.

Figure 10:
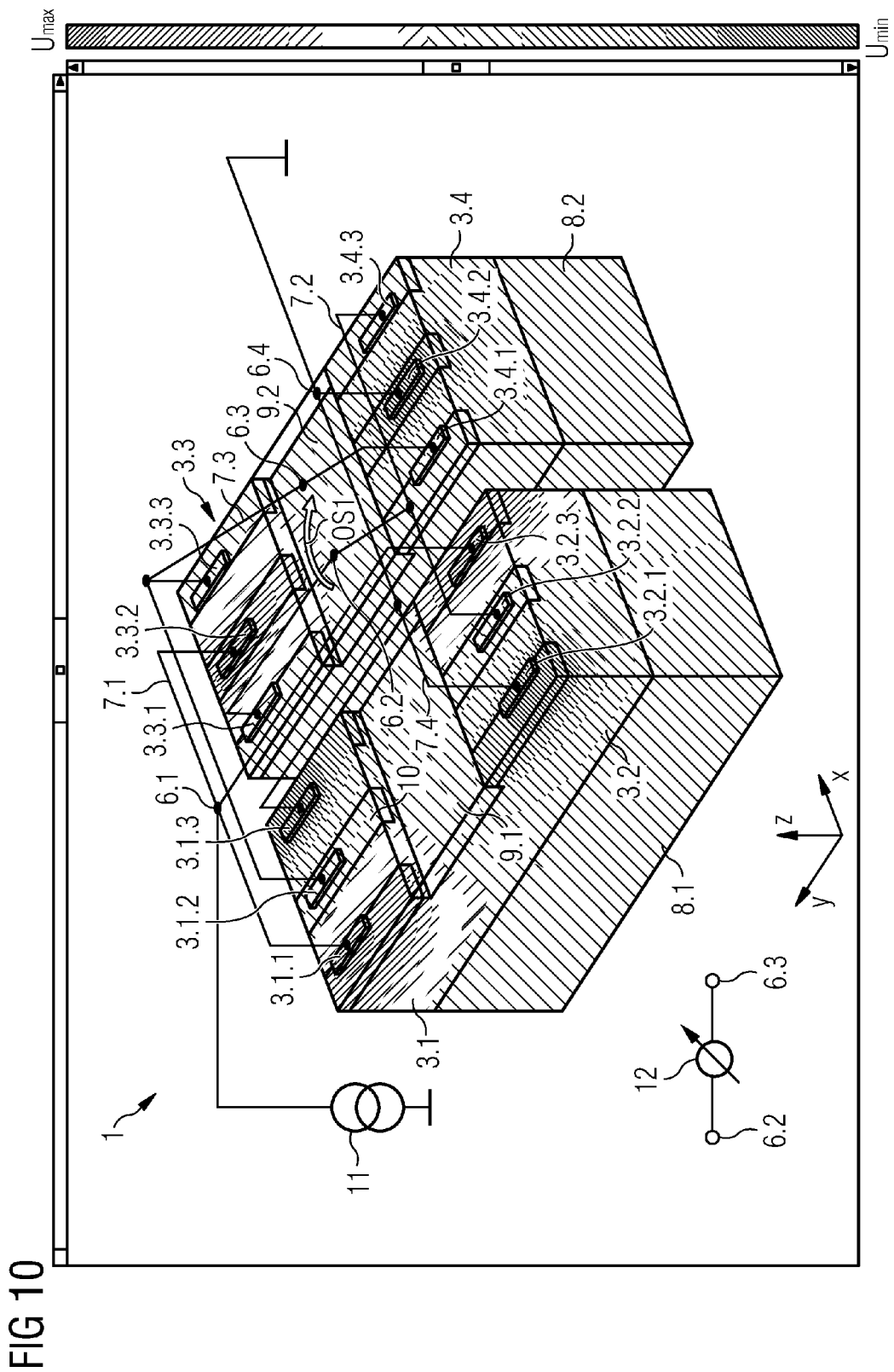
FIG. 10 shows in a perspective view a result of a numerical simulation of the electric potential in the fourth embodiment of a vertical Hall device, when the vertical Hall device is used in a first mode of operation.

FIG. 10 shows in a perspective view a result of a numerical simulation of the electric potential in the fourth embodiment of a vertical Hall device 1, when the vertical Hall device 1 is used in a first mode of operation.

Figure 11:
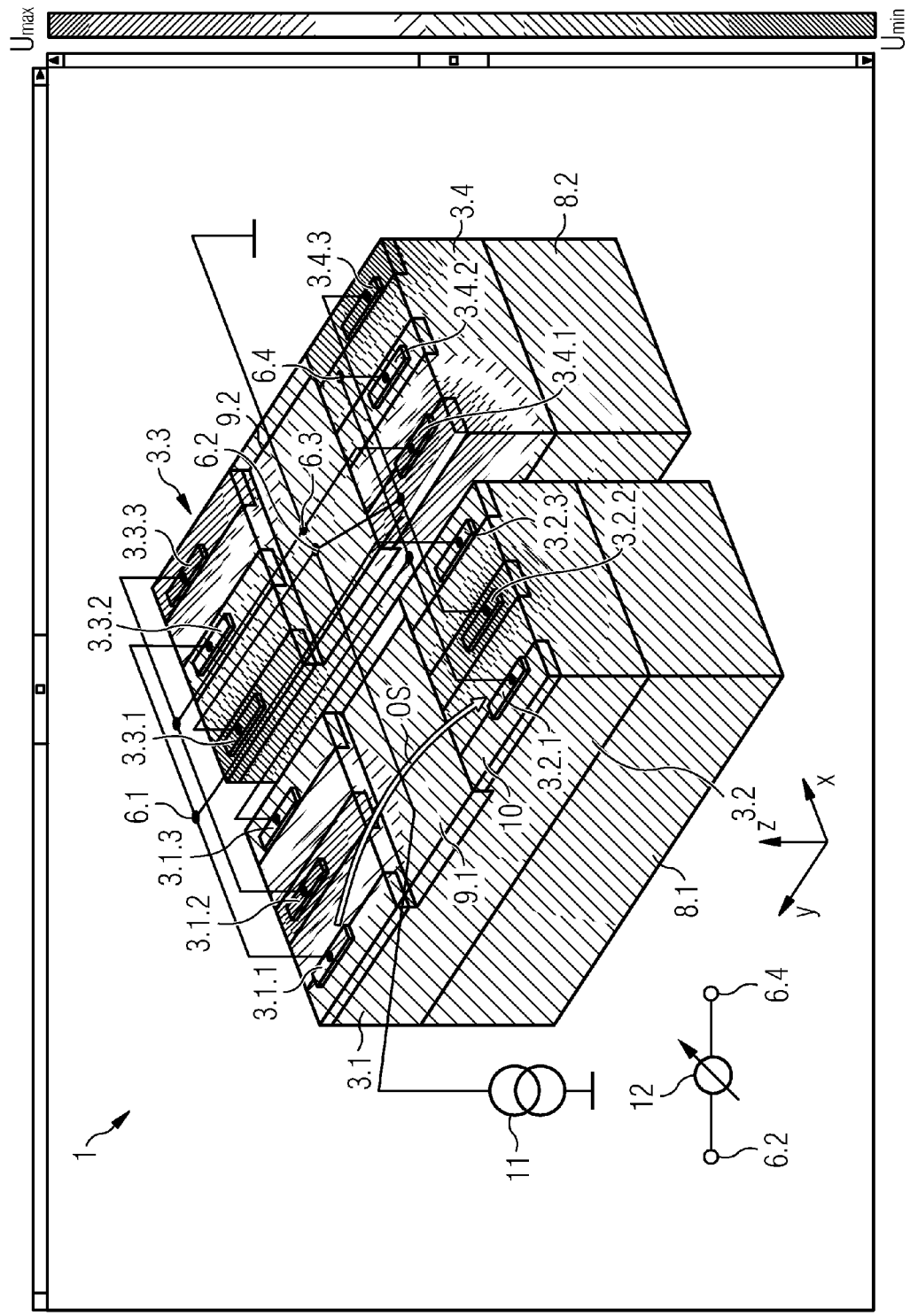
FIG. 11 shows in a perspective view a result of a numerical simulation of the electric potential in the fourth embodiment of the vertical Hall device, when the vertical Hall device is used in a second mode of operation.

FIG. 11 shows in a perspective view a result of a numerical simulation of the electric potential in the fourth embodiment of the vertical Hall device 1, when the vertical Hall device 1 is used in a second mode of operation.

It has to be understood that the fourth embodiment may have all features discussed in context with other embodiments unless stated otherwise.

In some embodiments each of the at least four Hall effect regions 3.1, 3.2, 3.3, 3.4 is connected at the first face 4 to a first contact 3.1.1, 3.2.1, 3.3.1, 3.4.1, to a second contact 3.1.2, 3.2.2, 3.3.2, 3.4.2, and to a third contact 3.1.3, 3.2.3, 3.3.3, 3.4.3, wherein the low ohmic connecting composition 7.1, 7.2, 7.3, 7.4 is arranged in such way, that the first terminal 6.1 is connected to the first contact 3.1.1 of the first Hall effect region 3.1, to the third contact 3.2.3 of the second Hall effect region 3.2 and to the second contact 3.3.2 of the third Hall effect region 3.3, that the second terminal 6.2 is connected to the second contact 3.2.2 of the second Hall effect region 3.2, to the first contact 3.3.1 of the third Hall effect region 3.3 and to the third contact 3.4.3 of the fourth Hall effect region 3.4, that the third terminal 6.3 is connected to the third contact 3.3.3 of the third Hall effect region 3.3, to the first contact 3.4.1 of the fourth Hall effect region 3.4 and to the second contact 3.1.2 of the first Hall effect region 3.1 and that the fourth terminal 6.4 is connected to the second contact 3.4.2 of the fourth Hall effect region 3.4, to the third contact 3.1.3 of the first Hall effect region 3.1 and to the first contact 3.2.1 of the second Hall effect region 3.2.

Figure 12:
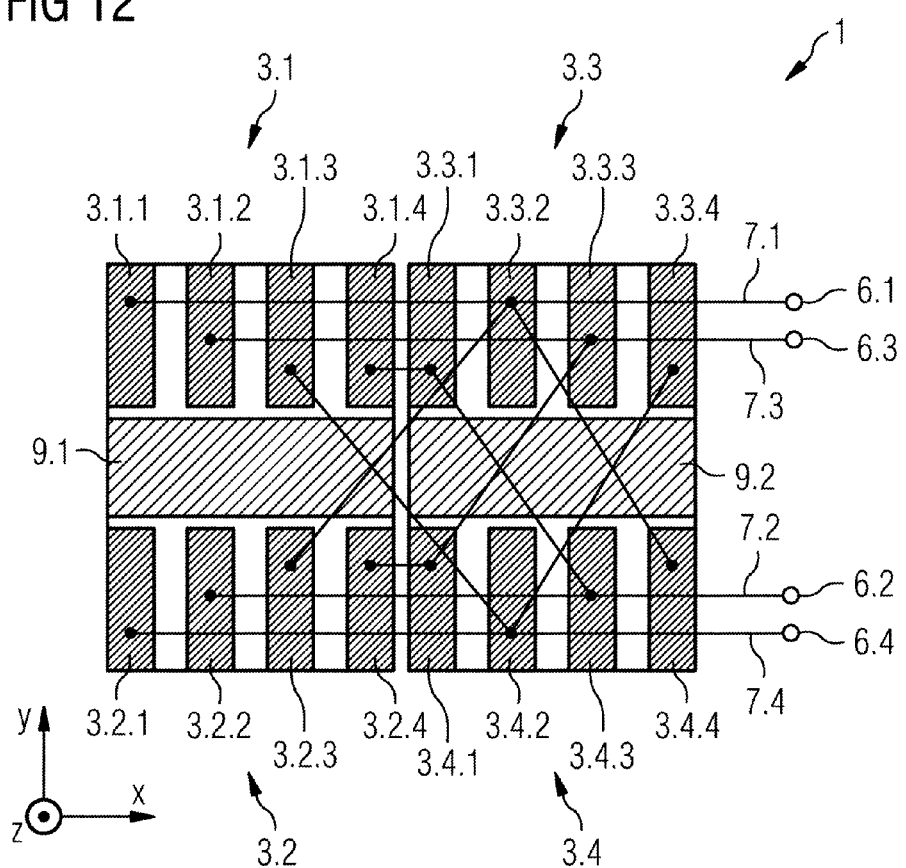
FIG. 12 shows a schematic top view of a fifth embodiment of a vertical Hall device, wherein each Hall effect region is connected at the first face by a first contact, a second contact, a third contact and a fourth contact.

FIG. 12 shows a schematic top view of a fifth embodiment of a vertical Hall device 1, wherein each Hall effect region 3.1, 3.2, 3.3, 3.4 is connected at the first face 4 by a first contact 3.1.1, 3.2.1, 3.3.1, 3.4.1, a second contact 3.1.2, 3.2.2, 3.3.2, 3.4.2, a third contact 3.1.3, 3.2.3, 3.3.3, 3.4.3 and a fourth contact 3.1.4, 3.2.4, 3.3.4, 3.4.4.

Figure 13:
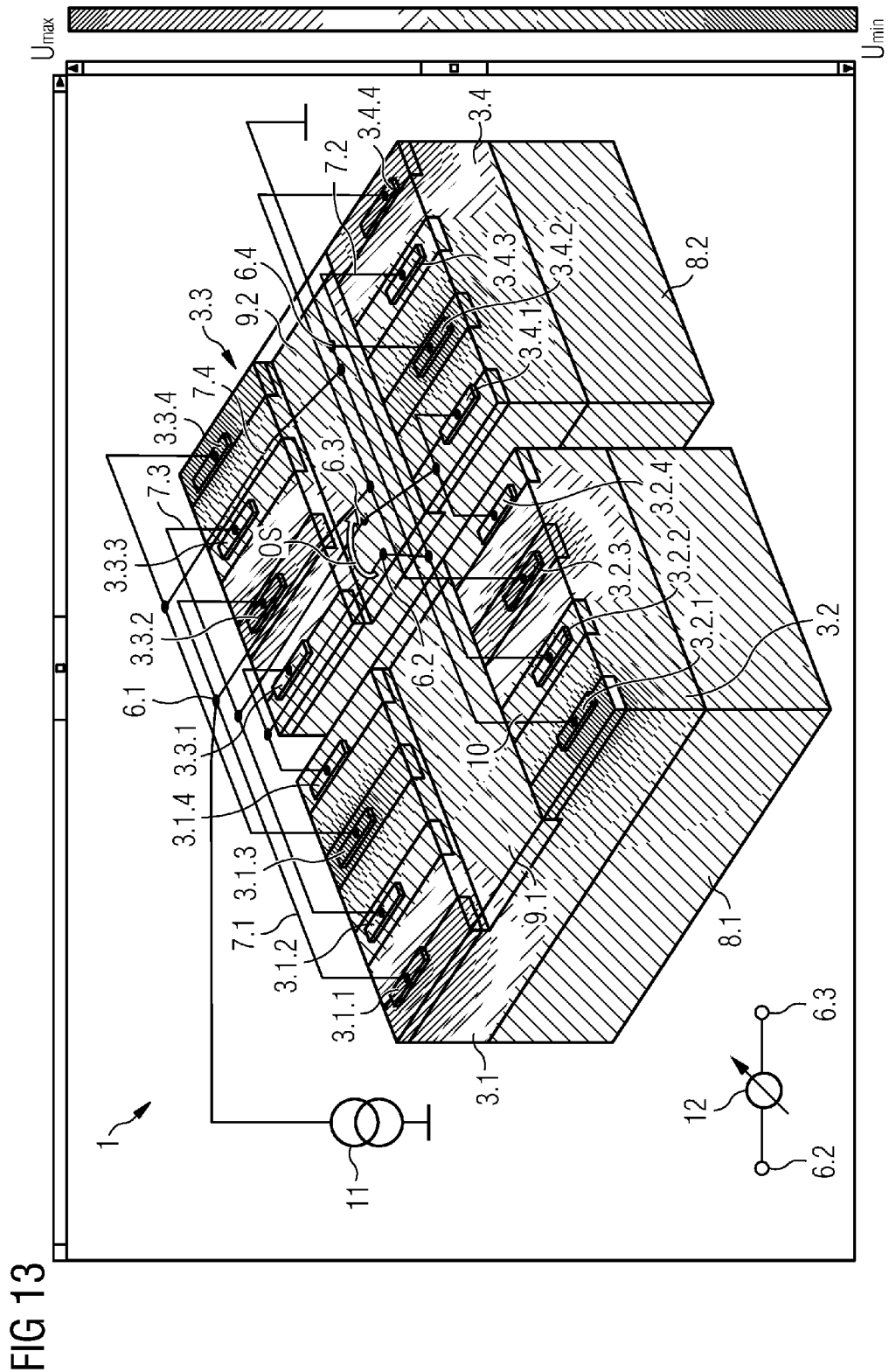
FIG. 13 shows in a perspective view a result of a numerical simulation of the electric potential in the fifth embodiment of a vertical Hall device, when the vertical Hall device is used in a first mode of operation.

FIG. 13 shows in a perspective view a result of a numerical simulation of the electric potential in the fifth embodiment of a vertical Hall device 1, when the vertical Hall 1 device is used in a first mode of operation.

Figure 14:
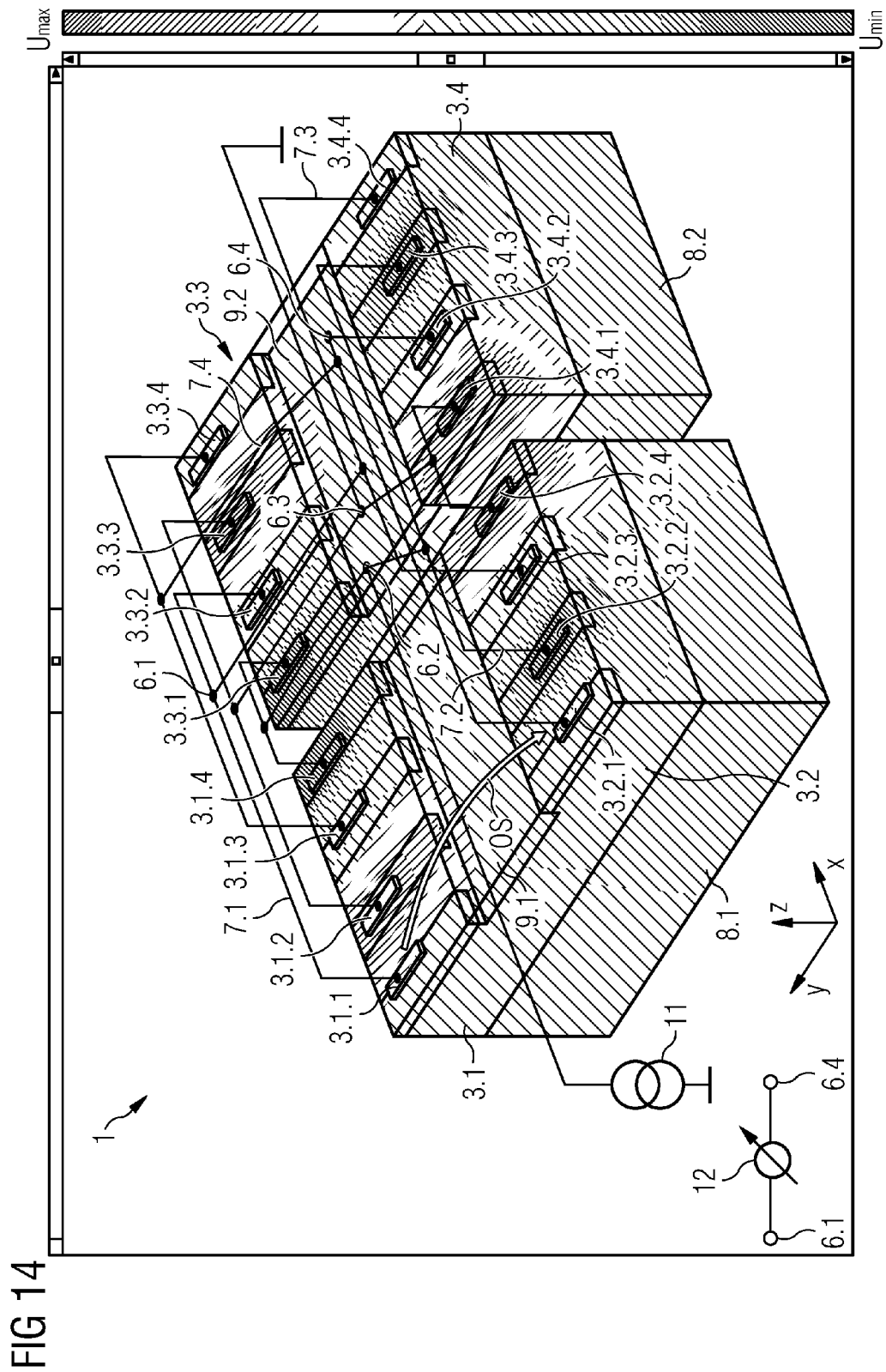
FIG. 14 shows in a perspective view a result of a numerical simulation of the electric potential in the fifth embodiment of the vertical Hall device, when the vertical Hall device is used in a second mode of operation.

FIG. 14 shows in a perspective view a result of a numerical simulation of the electric potential in the fifth embodiment of the vertical Hall device 1, when the vertical Hall device 1 is used in a second mode of operation.

It has to be understood that the fifth embodiment may have all features discussed in context with other embodiments unless stated otherwise.

In some embodiments each of the at least four Hall effect regions 3.1, 3.2, 3.3, 3.4 is connected at the first face 4 to a first contact 3.1.1, 3.2.1, 3.3.1, 3.4.1, to a second contact 3.1.2, 3.2.2, 3.3.2, 3.4.2, to a third contact 3.1.3, 3.2.3, 3.3.3, 3.4.3 and to a fourth contact 3.1.4, 3.2.4, 3.3.4, 3.4.4, wherein the low ohmic connecting composition 7.1, 7.2, 7.3, 7.4 is arranged in such way, that the first terminal 6.1 is connected to the first contact 3.1.1 of the first Hall effect region 3.1, to the third contact 3.2.3 of the second Hall effect region 3.2, to the second contact 3.3.2 of the third Hall effect region 3.3 and to the fourth contact 3.4.4 of the fourth Hall effect region 3.4, that the second terminal 6.2 is connected to the fourth contact 3.1.4 of the first Hall effect region 3.1, to the second contact 3.2.2 of the second Hall effect region 3.2, to the first contact 3.3.1 of the third Hall effect region 3.3 and to the third contact 3.4.3 of the fourth Hall effect region 3.4, that the third terminal 6.3 is connected to the second contact 3.1.2 of the first Hall effect region 3.1, to the fourth contact 3.2.4 of the second Hall effect region 3.2, to the third contact 3.3.3 of the third Hall effect region 3.3 and to the first contact 3.4.1 of the fourth Hall effect region 3.4 and that the fourth terminal 6.4 is connected to the third contact 3.1.3 of the first Hall effect region 3.1, to the first contact 3.2.1 of the second Hall effect region 3.2, to the fourth contact 3.3.4 of the third Hall effect region 3.3 and to the second contact 3.4.2 of the fourth Hall effect region 3.4.

Figure 15:
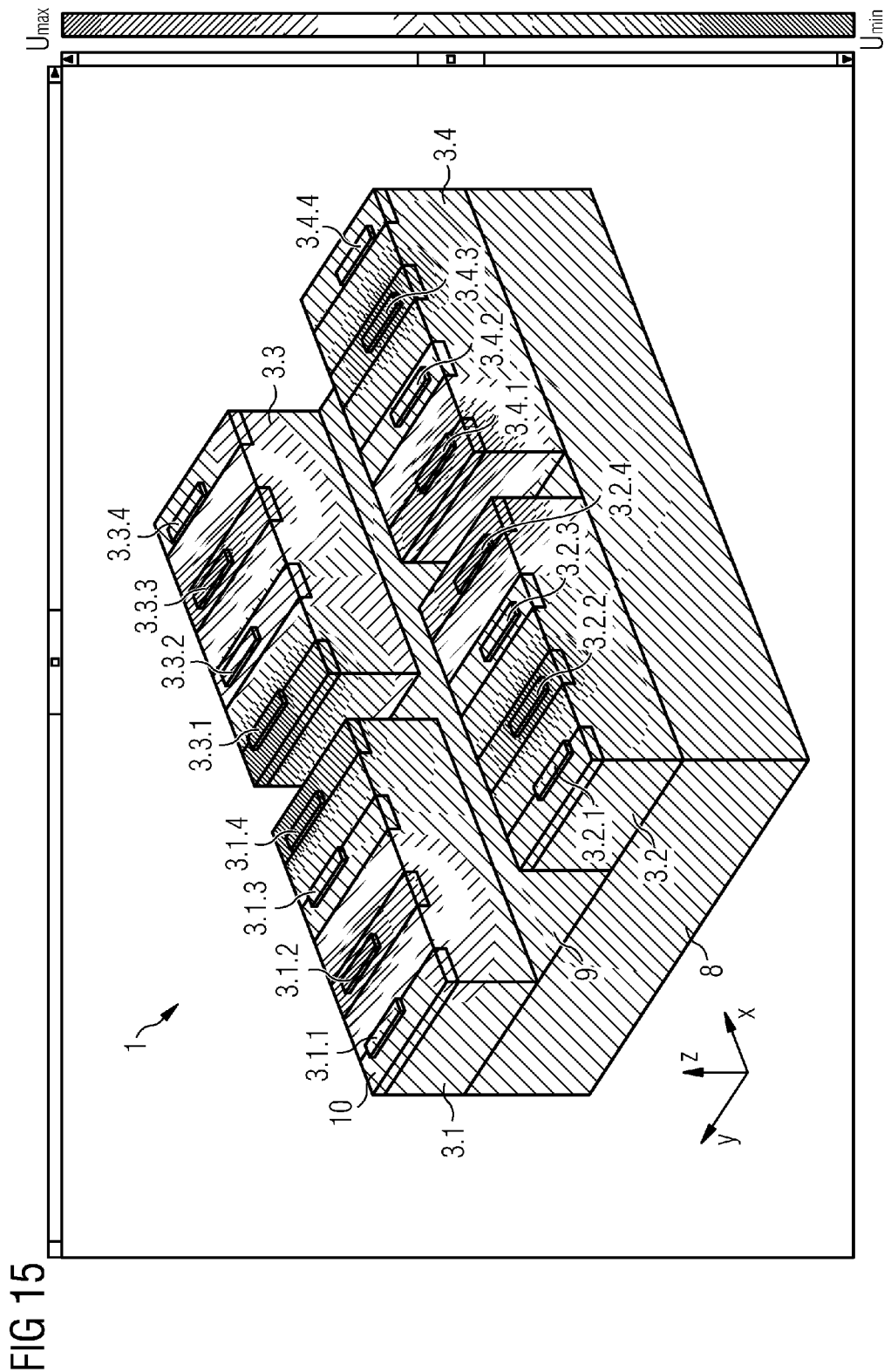
FIG. 15 shows in a perspective view a schematic top view of a sixth embodiment of a vertical Hall device, wherein the low ohmic layer composition comprises a common layer portion connecting the first Hall effect region, the second Hall effect region, the third Hall effect region and the fourth Hall effect region.

FIG. 15 shows in a perspective view a schematic top view of a sixth embodiment of a vertical Hall device 1, wherein the low ohmic layer composition 8 comprises a common layer portion 8 connecting the first Hall effect region 3.1, the second Hall effect region 3.2, the third Hall effect region 3.3 and the fourth Hall effect region 3.4.

Figure 16:
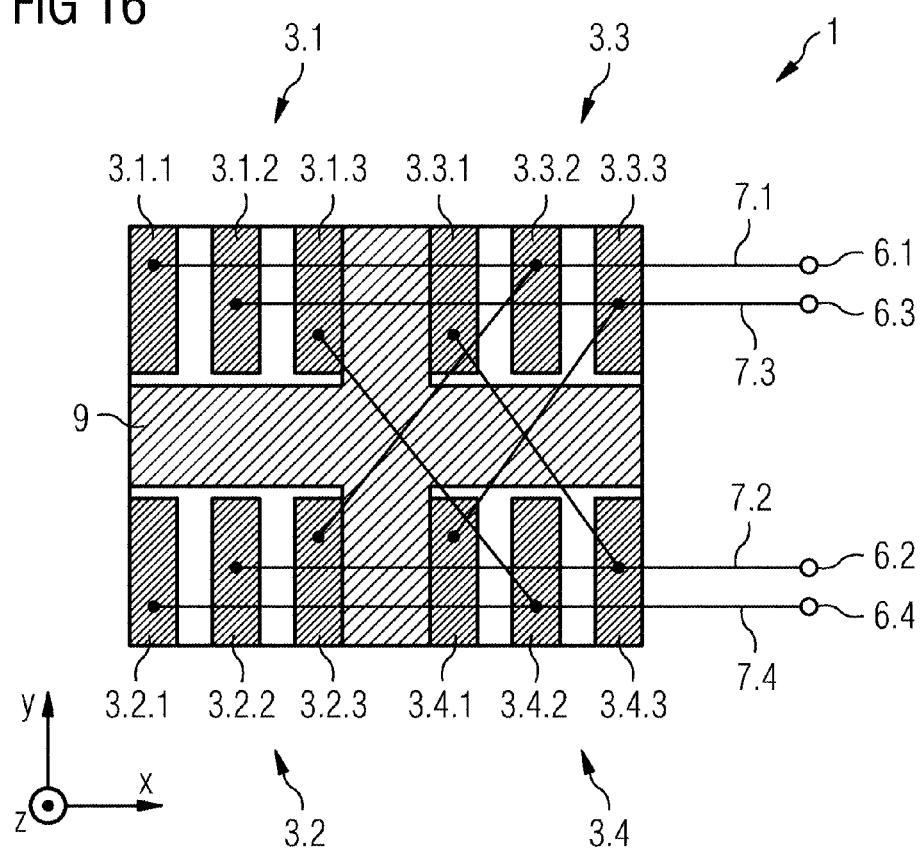
FIG. 16 shows a schematic top view of the sixth embodiment of a vertical Hall device.

FIG. 16 shows a schematic top view of the sixth embodiment of a vertical Hall device.

It has to be understood that the fourth embodiment may have all features discussed in context with other embodiments unless stated otherwise.

In some embodiments the low ohmic layer composition 8 comprises a common layer portion 8 connecting the first Hall effect region 3.1, the second Hall effect region 3.2, the third Hall effect region 3.3 and the fourth Hall effect region 3.4.

Figure 17:
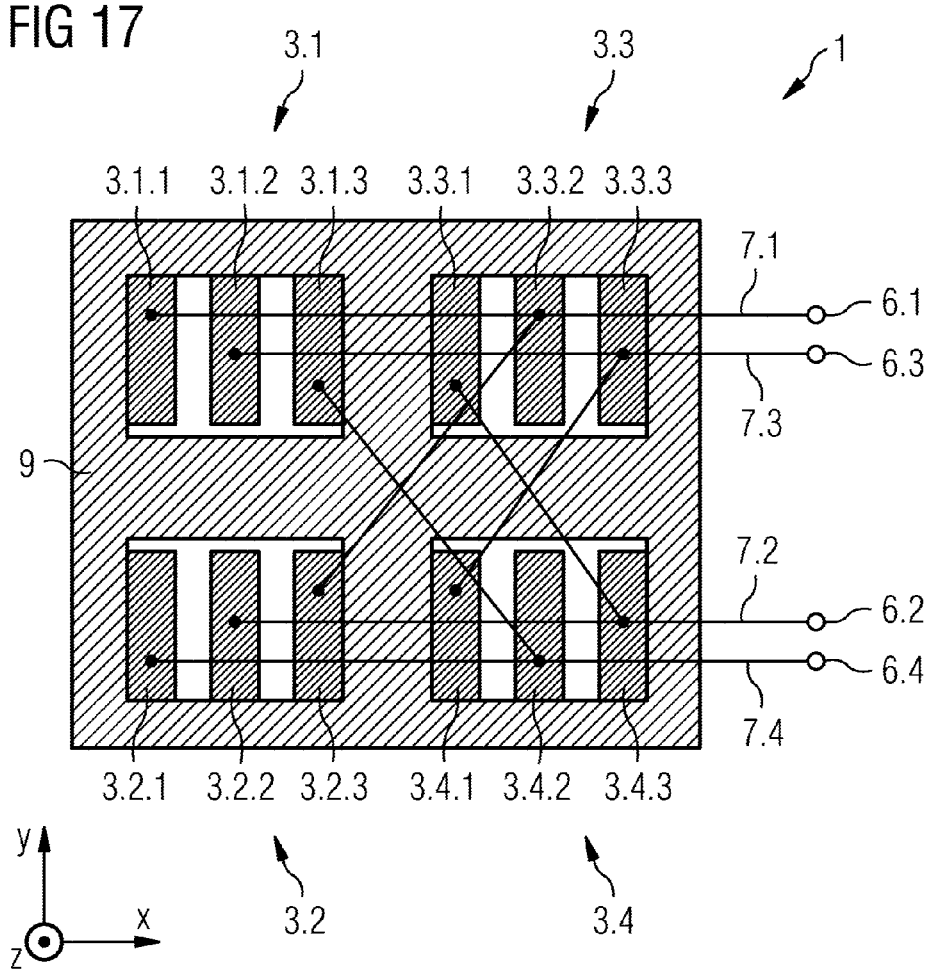
FIG. 17 shows in a perspective view a schematic top view of a seventh embodiment of a vertical Hall device, wherein the low ohmic layer composition comprises a common layer portion connecting the first Hall effect region, the second Hall effect region, the third Hall effect region and the fourth Hall effect region.

FIG. 17 shows in a perspective view a schematic top view of a seventh embodiment of a vertical Hall device, wherein the low ohmic layer composition comprises a common layer portion connecting the first Hall effect region, the second Hall effect region, the third Hall effect region and the fourth Hall effect region. The seventh embodiment is based on the sixth embodiment. However, the common layer portion 8 and/or the decoupling portion 9 exceed in the top view the outline of the Hall effect regions 3.1, 3.2, 3.3, 3.4.

Figure 18:
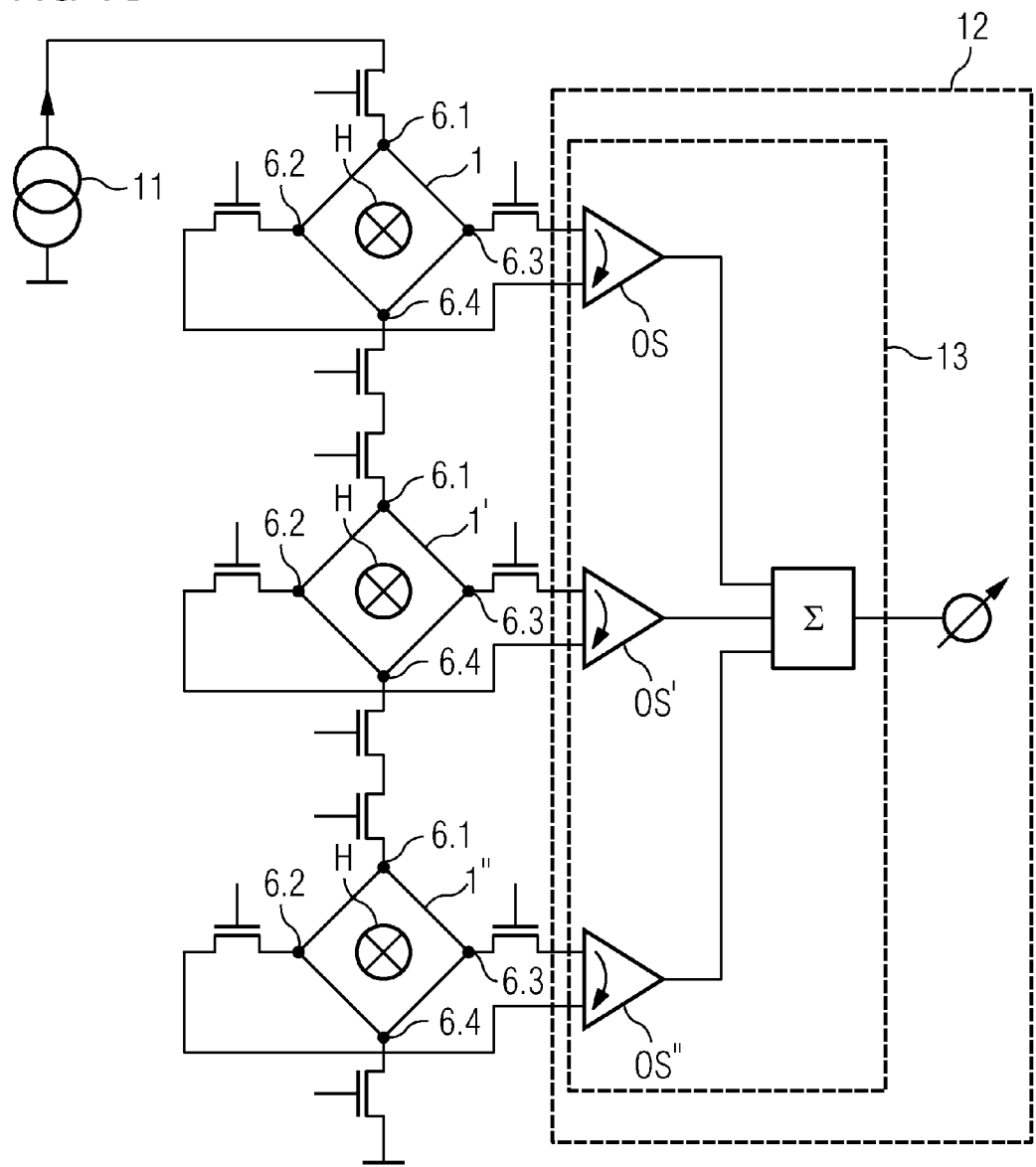
FIG. 18 shows a schematic top view of a system comprising 3 vertical Hall effect devices connected in series.

FIG. 18 shows a schematic top view of a system comprising 3 vertical Hall effect devices 1, 1', 1" connected in series.

The system comprises at least two, for example three, Hall effect devices 1, 1', 1", wherein the vertical Hall devices 1, 1', 1" are connected in series so that at least 75% of a supply current flowing through a first vertical Hall device 1 is flowing through a second Hall effect device 1'.

In some embodiments each vertical Hall effect device 1, 1', 1" provides at least one electrical Hall signal OS, OS', OS" which are combined by a combining unit 13. Combining unit may for instance comprise an adding unit or a multiplying unit.

In all embodiments described above the low ohmic layer composition 8, 8.1, 8.2 reduces the currents through the signal contacts 3.1.1, 3.2.1, 3.3.1, 3.4.1, 3.1.2, 3.2.2, 3.3.2, 3.4.2, 3.1.3, 3.2.3, 3.3.3, 3.4.3 and 3.1.4, 3.2.4, 3.3.4, 3.4.4 and it does this all the more efficiently the more Hall regions 3.1, 3.2, 3.3, 3.4 the low ohmic layer composition 8, 8.1, 8.2 shorts.

Instead of a buried layer 8, 8.1, 8.2 the highly conductive layer 8, 8.1, 8.2 can be manufactured by ion implantation with a large dose, whereby the peak of the doping profile is underneath the Hall effect region 3.1, 3.2, 3.3, 3.4. Thereby it is not necessary that the highly conductive layer contacts 8, 8.1, 8.2 the entire bottom surface of each Hall effect region: it is sufficient to contact a small portion of the bottom surface of each Hall effect region 3.1, 3.2, 3.3, 3.4. The voltage drop due to this contact should be negligible in order to make most efficient use of the supply voltage, yet if one accepts to spend e.g. 25% of the supply voltage along this contact it would also work in principle, yet with poor power efficiency.

The contacts 3.1.1, 3.2.1, 3.3.1, 3.4.1, 3.1.2, 3.2.2, 3.3.2, 3.4.2, 3.1.3, 3.2.3, 3.3.3, 3.4.3 and 3.1.4, 3.2.4, 3.3.4, 3.4.4 can be lined up along a single line, e.g. a straight line or the can be aligned along the perimeter of a rectangle or square or disc or ellipse. If they are aligned on such a curve it is possible to place a wire above all of them: this wire can carry a current which generates a magnetic field. This can be used to calibrate the sensor elements either during the production or in the field.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A vertical Hall effect device comprising:
a Hall effect layer comprising at least a first Hall effect region, a second Hall effect region, a third Hall effect region and a fourth Hall effect region, which are at least partly decoupled from each other;
wherein the Hall effect layer has a first face and a second opposite face;
wherein the vertical Hall effect device has a terminal composition comprising a first terminal, a second terminal, a third terminal and a fourth terminal;
wherein a low ohmic connecting composition at the first face connects the terminal composition with contacts of the Hall effect regions in such a way that at each Hall effect region the terminal composition is connected to a same first number of at least two contacts being connected to the respective Hall effect region at the first face;
wherein the second terminal and the third terminal output an electrical signal responsive to a magnetic field, if an electrical energy is supplied to the first terminal and to the fourth terminal and wherein the first terminal and the fourth terminal output the electrical signal responsive to the magnetic field, if an electric energy is supplied to the second terminal and to the third terminal; and
wherein a low ohmic layer composition having one or more layer portions; is arranged closer to the second face than to the first face, wherein the low ohmic layer composition connects each of the at least four Hall effect regions to at least one other of the at least four Hall effect regions.

2. A vertical Hall effect device according to claim 1, wherein the low ohmic connecting composition comprises a low ohmic wiring composition.

3. A vertical Hall effect device according to claim 1, wherein the low ohmic connecting composition connects the contacts and the terminals in such a way that each of the contacts is connected to exactly one of the terminals.

4. A vertical Hall effect device according to claim 1, wherein the low ohmic connecting composition connects the contacts and the terminals in such a way that each of the four terminals is connected to a same second number of contacts.

5. A vertical Hall effect device according to claim 1, wherein the low ohmic connecting composition connects the contacts and the terminals in such a way that each of the four terminals is connected to contacts of a same third number of different Hall effect regions.

6. A vertical Hall effect device according to claim 1, wherein each of the at least four Hall effect regions is connected at the first face to a first contact and to a second contact, wherein the low ohmic connecting composition is arranged in such a way, that the first terminal is connected to the first contact of the first Hall effect region and to the second contact of the third Hall effect region, that the second terminal is connected to the second contact of the first Hall effect region and to the first contact of the fourth Hall effect region, that the third terminal is connected to the second contact of the second Hall effect region and to the first contact of the third Hall effect region and that the fourth terminal is connected to the first contact of the second Hall effect region and to the second contact of the fourth Hall effect region.

7. A vertical Hall effect device according to claim 1, wherein each of the at least four Hall effect regions is connected at the first face to a first contact, to a second contact and to a third contact, wherein the low ohmic connecting composition is arranged in such way, that the first terminal is connected to the first contact of the first Hall effect region, to the third contact of the second Hall effect region and to the second contact of the third Hall effect region, that the second terminal is connected to the second contact of the second Hall effect region, to the first contact of the third Hall effect region and to the third contact of the fourth Hall effect region, that the third terminal is connected to the third contact of the third Hall effect region, to the thirst contact of the fourth Hall effect region and to the second contact of the first Hall effect region and that the fourth terminal is connected to the second contact of the fourth Hall effect region, to the third contact of the first Hall effect region and to the first contact of the second Hall effect region.

8. A vertical Hall effect device according to claim 1, wherein each of the at least four Hall effect regions is connected at the first face to a first contact, to a second contact, to a third contact and to a fourth contact, wherein the low ohmic connecting composition is arranged in such way, that the first terminal is connected to the first contact of the first Hall effect region, to the third contact of the second Hall effect region, to the second contact of the third Hall effect region and to the fourth contact of the fourth Hall effect region, that the second terminal is connected to the fourth contact of the first Hall effect region, to the second contact of the second Hall effect region, to the first contact of the third Hall effect region and to the third contact of the fourth Hall effect region, that the third terminal is connected to the second contact of the first Hall effect region, to the fourth contact of the second Hall effect region, to the third contact of the third Hall effect region and to the first contact of the fourth Hall effect region and that the fourth terminal is connected to the third contact of the first Hall effect region, to the first contact of the second Hall effect region, to the fourth contact of the third Hall effect region and to the second contact of the fourth Hall effect region.

9. A vertical Hall effect device according to claim 1, wherein the low ohmic layer composition is arranged in such a way, that the entire second faces of the Hall effect regions are in ohmic contact with the low ohmic layer composition.

10. A vertical Hall effect device according to claim 1, wherein the low ohmic layer composition comprises a first layer portion connecting the first Hall effect region and the second Hall effect region, and wherein the low ohmic layer composition comprises a second layer portion connecting the third Hall effect region and the fourth Hall effect region.

11. A vertical Hall effect device according to claim 1, wherein the low ohmic layer composition comprises a common layer portion connecting the first Hall effect region, the second Hall effect region, the third Hall effect region and the fourth Hall effect region.

12. A vertical Hall effect device according to claim 1, wherein the first Hall effect region and the second Hall effect region are arranged in such a way that they are sensitive to magnetic fields having a first common direction, and wherein the third Hall effect region and the fourth Hall effect region are arranged in such a way that they are sensitive to magnetic fields having a second common direction different from the first direction.

13. A vertical Hall effect device according to claim 1, wherein the first common direction and the second common direction are identical.

14. A vertical Hall effect device according to claim 12, wherein the first common direction and the second common direction are perpendicular with respect to each other.

15. A vertical Hall effect device according to claim 1, wherein the first Hall effect region and the second Hall effect region are arranged in a first row, wherein the third Hall effect region and the fourth Hall effect region are arranged in a second row being parallel to the first row, wherein the first Hall effect region and the third Hall effect region are facing each other, and wherein the second Hall effect region and the fourth Hall effect region are facing each other.

16. A vertical Hall effect device according to claim 1, wherein the first Hall effect region, the second Hall effect region, the third Hall effect region and the fourth Hall effect region are arranged in a common row.

17. A vertical Hall effect device according to claim 1, wherein at least two of the Hall effect regions are decoupled by a minimum distance in a top view between the contacts of the two Hall effect regions greater than half of the depth of the Hall effect regions, by a reverse biased pn-junction and/or by a trench-wall coated with an insulating dielectric thin film.

18. A vertical Hall effect device according to claim 1, wherein the terminals are connected to an energy supply and measuring circuit being configured
in such a way that in a first mode of operation
the first terminal and the third terminal are used to supply the Hall effect regions with electrical energy, and the second terminal and the fourth terminal are used for tapping an electrical Hall output signal responsive to the magnetic field, and
in such a way that in a second mode of operation
the second terminal and the fourth terminal are used to supply the Hall effect regions with electrical energy, and the third terminal and the first terminal are used for tapping an electrical Hall output signal responsive to the magnetic field.

19. A vertical Hall effect device according to claim 18, wherein the energy supply and measuring circuit is configured to execute a measuring cycle having at least a first phase in which the device operates in one of said modes of operations and a second phase in a different one of said modes of operations.

20. A vertical Hall effect device according to claim 1, wherein low ohmic is defined as: having an electrical conductivity which is at least 10 times the conductivity of the Hall effect region.

21. A system comprising at least two vertical Hall effect devices, wherein each of the two vertical Hall effect devices comprise:
a Hall effect layer comprising at least a first Hall effect region, a second Hall effect region, a third Hall effect region and a fourth Hall effect region, which are at least partly decoupled from each other;
wherein the Hall effect layer has a first face and a second opposite face;
wherein the vertical Hall effect device has a terminal composition comprising a first terminal, a second terminal, a third terminal and a fourth terminal;
wherein a low ohmic connecting composition at the first face connects the terminal composition with contacts of the Hall effect regions in such a way that at each Hall effect region the terminal composition is connected to a same first number of at least two contacts being connected to the respective Hall effect region at the first face;
wherein the second terminal and the third terminal output an electrical signal responsive to a magnetic field, if an electrical energy is supplied to the first terminal and to the fourth terminal and wherein the first terminal and the fourth terminal output the electrical signal responsive to the magnetic field, if an electric energy is supplied to the second terminal and to the third terminal; and
wherein a low ohmic layer composition having one or more layer portions; is arranged closer to the second face than to the first face, wherein the low ohmic layer composition connects each of the at least four Hall effect regions to at least one other of the at least four Hall effect regions, and
wherein the two vertical Hall effect devices are connected in series so that at least 75% of a supply current flowing through a first vertical Hall effect device of the two vertical Hall effect devices is flowing through a second Hall effect device of the two vertical Hall effect devices.

22. A system according to claim 21, wherein each of the at least two vertical Hall effect devices provides at least one electrical Hall signal, wherein the electrical Hall signals of the at least two vertical Hall devices are combined by a combining unit.

* * * * *